(12) United States Patent
Oh et al.

(10) Patent No.: US 11,775,099 B2
(45) Date of Patent: Oct. 3, 2023

(54) TOUCH SENSING MODULE AND ELECTRONIC DEVICE INCLUDING THE SAME

(71) Applicant: SAMSUNG ELECTRO-MECHANICS CO., LTD., Suwon-si (KR)

(72) Inventors: Hee Sun Oh, Suwon-si (KR); Gye Won Lee, Suwon-si (KR); Hong Seok Lee, Suwon-si (KR); Chang Ju Lee, Suwon-si (KR); Jong Yun Kim, Suwon-si (KR)

(73) Assignee: Samsung Electro-Mechanics Co., Ltd., Suwon-si (KR)

( * ) Notice: Subject to any disclaimer, the term of this patent is extended or adjusted under 35 U.S.C. 154(b) by 85 days.

(21) Appl. No.: 17/388,234

(22) Filed: Jul. 29, 2021

(65) Prior Publication Data

US 2022/0121340 A1   Apr. 21, 2022

(30) Foreign Application Priority Data

Oct. 16, 2020  (KR) .......................... 10-2020-0133941
Mar. 22, 2021  (KR) .......................... 10-2021-0036792

(51) Int. Cl.
*G06F 3/041* (2006.01)
*G06F 3/044* (2006.01)
*H03K 17/96* (2006.01)

(52) U.S. Cl.
CPC .......... *G06F 3/04144* (2019.05); *G06F 3/044* (2013.01); *G06F 3/0412* (2013.01); *G06F 3/04186* (2019.05); *H03K 17/962* (2013.01); *H03K 17/9625* (2013.01); *G06F 2203/04105* (2013.01); *H03K 2217/96023* (2013.01); *H03K 2217/960735* (2013.01)

(58) Field of Classification Search
CPC .... G06F 3/04144; G06F 3/0416; G06F 3/044; G06F 3/0412; G06F 3/0414; G06F 2203/04105; H03K 17/962; H03K 17/964; H03K 2017/9706; H03K 2217/960735
See application file for complete search history.

(56) References Cited

U.S. PATENT DOCUMENTS

| | | | |
|---|---|---|---|
| 2007/0296702 A1 | 12/2007 | Strawn et al. | |
| 2015/0136446 A1* | 5/2015 | Ryu | H05K 3/4688 174/251 |
| 2019/0339776 A1* | 11/2019 | Rosenberg | G06F 3/0416 |
| 2021/0019009 A1* | 1/2021 | Jung | G06F 3/044 |
| 2021/0239543 A1 | 8/2021 | Yim et al. | |

FOREIGN PATENT DOCUMENTS

| | | |
|---|---|---|
| KR | 10-0996646 B1 | 11/2010 |
| KR | 10-2021-0099946 A | 8/2021 |

* cited by examiner

*Primary Examiner* — Priyank J Shah
(74) *Attorney, Agent, or Firm* — NSIP Law

(57) ABSTRACT

A touch sensing module includes a sensing coil, a metal portion disposed to be spaced apart from the sensing coil, and a first bracket having one surface, on which the metal portion is disposed, and an other surface, opposing the one surface, on which a pad having a capacitance, configured to vary as a touch is applied, is disposed.

25 Claims, 13 Drawing Sheets

TOUCH SENSING MODULE AND ELECTRONIC DEVICE INCLUDING THE SAME

CROSS-REFERENCE TO RELATED APPLICATIONS

This application claims the benefit under 35 USC 119(a) of Korean Patent Application Nos. 10-2020-0133941 filed on Oct. 16, 2020, and 10-2021-0036792 filed on Mar. 22, 2021, in the Korean Intellectual Property Office, the entire disclosures of which are incorporated herein by reference for all purposes.

BACKGROUND

1. Field

The present disclosure relates to a touch sensing module and an electronic device including the same.

2. Description of the Background

In general, a thinner, simpler, and neater design may be preferred for a wearable device, and accordingly, a conventional mechanical switch may be disappearing. This has become possible as a model with a sense of unity in a smooth design is developed, together with implementation of dust-proof and water-proof technologies.

Currently, a touch on metal (ToM) technology, a capacitor sensing technology using a touch panel, a micro electro-mechanical system (MEMS), a micro strain gauge technology, and the like have been developed. Furthermore, even a force touch function has been developed in a recent trend.

The conventional mechanical switch internally requires a large-sized space to implement a switching function, and externally, has a structure that protrudes outwardly or is not integrally formed with an outer case. Thus, a conventional mechanical switch may be disadvantageous in that the design may not be neat and a large amount of space may be occupied thereby.

Also, the conventional mechanical switch may be disadvantageous in that a user may directly contact the electrically connected mechanical switch, resulting in the risk of an electric shock, and in particular, it may be difficult to achieve dustproofing and waterproofing in the structure of the mechanical switch.

The above information is presented as background information only to assist with an understanding of the present disclosure. No determination has been made, and no assertion is made, as to whether any of the above might be applicable as prior art with regard to the disclosure.

SUMMARY

This Summary is provided to introduce a selection of concepts in simplified form that are further described below in the Detailed Description. This Summary is not intended to identify key features or essential features of the claimed subject matter, nor is it intended to be used as an aid in determining the scope of the claimed subject matter.

In one general aspect, a touch sensing module includes a sensing coil, a metal portion disposed to be spaced apart from the sensing coil, and a first bracket having one surface, on which the metal portion is disposed, and an other surface, opposing the one surface, on which a pad having capacitance configured to vary as a touch is applied, is disposed.

The metal portion may include a connection portion connected to the first bracket, and a pressurization portion extending from the connection portion and configured to deform as a touch is applied.

The touch sensing module may further include a first substrate having an area in which the sensing coil is disposed, wherein the pressurization portion may have one end connected to the connection portion, and an other end connected to the first substrate.

The touch sensing module may further include a second bracket supporting the first substrate.

The metal portion may further include a sensing region protruding in a direction, in which the sensing coil is disposed, and overlapping a winding surface of the sensing coil.

The touch sensing module may further include a first substrate having an area in which the sensing coil is disposed, wherein the metal portion may be disposed to be spaced from the first substrate.

The touch sensing module may further include a second bracket supporting the first substrate, wherein the second bracket may include a support portion in contact with the first substrate, and an elastic portion receiving a pressure from the support portion configured to be compressed to be deformed.

The touch sensing module may further include a second substrate having an area in which the pad is disposed.

The first and second substrates may be connected to each other to form a single substrate.

The sensing coil and the pad may be electrically connected to each other to form a resonance circuit, and the resonance circuit may generate a resonance signal having a resonant frequency configured to vary as a touch is applied.

The touch sensing module may further include a detection circuit electrically connected to the resonance circuit and configured to generate a touch input signal based on an amount of a change in the resonant frequency of the generated resonance signal.

The detection circuit may detect a position, to which a touch is applied, based on a change in resonant frequency depending on a change in capacitance of the pad, and generate a contact touch input signal including information of the detected position.

The detection circuit may detect an intensity of a pressure, generated by a touch, based on a change in resonant frequency depending on a change in inductance of the sensing coil, and generate a force touch input signal matching the detected intensity of the pressure.

The pad may constitute a pad resonance circuit, and the sensing coil may constitute a sensing coil circuit. The pad resonance circuit and the sensing coil resonance circuit may generate a first resonance signal and a second resonance signal having resonant frequencies varying as a touch is applied, respectively.

The touch sensing module may further include a detection circuit electrically connected to the pad resonance circuit and the sensing coil resonance circuit, wherein the detection circuit may generate a contact touch input signal based on an amount of a change in resonant frequency of the first resonance circuit, and generate a force touch input signal based on an amount of a change in resonant frequency of the second resonance signal.

An electronic device may include the touch sensing module, and a housing comprising a touch switch portion overlapping the touch sensing module.

In another general aspect, an electronic device includes a housing including an outer housing, including a touch switch portion, and an inner housing disposed to be spaced apart from the outer housing, and a touch sensing module disposed between the outer housing and the inner housing. The touch sensing module includes a sensing coil disposed to be spaced apart from the outer housing, a metal portion disposed between the outer housing and the sensing coil and spaced apart from the sensing coil, and a first bracket having one surface, facing the inner housing, on which the metal portion is disposed, and an other surface, facing the outer housing, on which a pad, having capacitance configured to vary as a touch is applied, is disposed.

The metal portion may include a connection portion in contact with the first bracket, and a pressurization portion extending from the connection portion in a direction toward the inner housing and configured to deform as a touch is applied.

The electronic device may further include a first substrate having an area in which the sensing coil is disposed, and a second bracket disposed between the first substrate and the inner housing to support the first substrate.

The second bracket may include a support portion in contact with the first substrate, and an elastic portion receiving a pressure from the support portion configured to be compressed to be deformed.

The touch sensing module may include a plurality of touch sensing modules, and the touch switch portion may include a plurality of touch switch portions, respectively corresponding to the plurality of touch sensing modules.

First brackets, included in the plurality of touch sensing modules, may be formed to be separated from each other and metal portions, included in the plurality of touch sensing modules, may be formed to be separated from each other.

At least partial regions of the touch switch portion, the pad, and the sensing coil may overlap each other.

In another general aspect, a touch sensing module includes a pad, a first bracket, a metal portion, and a sensing coil facing and spaced apart from the metal portion, disposed in this order in a touch direction which is a direction in which a touch is applied, wherein the pad includes a capacitance configured to vary in response to a touch.

The touch sensing module may further include a second bracket disposed such that the sensing coil is between the metal portion and the second bracket.

The metal portion may include a pressurization portion extending in the touch direction configured to deform in response to the touch, and/or the second bracket may include an elastic portion extending in the touch direction configured to deform in response to the touch.

Other features and aspects will be apparent from the following detailed description, the drawings, and the claims.

BRIEF DESCRIPTION OF DRAWINGS

Throughout the drawings and the detailed description, the same reference numerals refer to the same elements. The drawings may not be to scale, and the relative sizes, proportions, and depictions of elements in the drawings may be exaggerated for clarity, illustration, and convenience.

DETAILED DESCRIPTION

Figure 1:
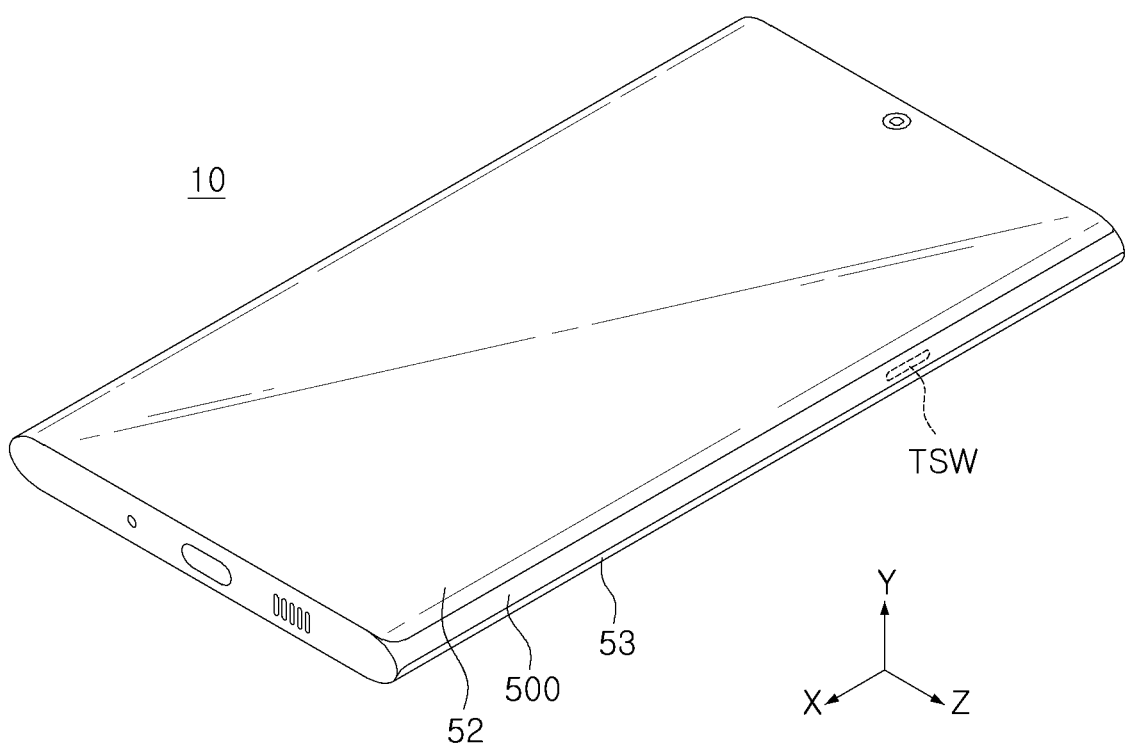
FIG. 1 is a perspective view illustrating an exterior of an electronic device according to an embodiment.

Hereinafter, while examples of the present disclosure will be described in detail with reference to the accompanying drawings, it is noted that examples are not limited to the same.

The following detailed description is provided to assist the reader in gaining a comprehensive understanding of the methods, apparatuses, and/or systems described herein. However, various changes, modifications, and equivalents of the methods, apparatuses, and/or systems described herein will be apparent after an understanding of this disclosure. For example, the sequences of operations described herein are merely examples, and are not limited to those set forth herein, but may be changed as will be apparent after an understanding of this disclosure, with the exception of operations necessarily occurring in a certain order. Also, descriptions of features that are known in the art may be omitted for increased clarity and conciseness.

The features described herein may be embodied in different forms, and are not to be construed as being limited to the examples described herein. Rather, the examples described herein have been provided merely to illustrate some of the many possible ways of implementing the methods, apparatuses, and/or systems described herein that will be apparent after an understanding of this disclosure.

Throughout the specification, when an element, such as a layer, region, or substrate is described as being "on," "connected to," or "coupled to" another element, it may be directly "on," "connected to," or "coupled to" the other element, or there may be one or more other elements intervening therebetween. In contrast, when an element is described as being "directly on," "directly connected to," or "directly coupled to" another element, there can be no other elements intervening therebetween.

As used herein, the term "and/or" includes any one and any combination of any two or more of the associated listed items; likewise, "at least one of" includes any one and any combination of any two or more of the associated listed items.

Although terms such as "first," "second," and "third" may be used herein to describe various members, components, regions, layers, or sections, these members, components, regions, layers, or sections are not to be limited by these terms. Rather, these terms are only used to distinguish one member, component, region, layer, or section from another member, component, region, layer, or section. Thus, a first member, component, region, layer, or section referred to in examples described herein may also be referred to as a second member, component, region, layer, or section without departing from the teachings of the examples.

Spatially relative terms, such as "above," "upper," "below," "lower," and the like, may be used herein for ease of description to describe one element's relationship to another element as shown in the figures. Such spatially relative terms are intended to encompass different orientations of the device in use or operation in addition to the orientation depicted in the figures. For example, if the device in the figures is turned over, an element described as being "above," or "upper" relative to another element would then be "below," or "lower" relative to the other element. Thus, the term "above" encompasses both the above and below orientations depending on the spatial orientation of the device. The device may also be oriented in other ways (rotated 90 degrees or at other orientations), and the spatially relative terms used herein are to be interpreted accordingly.

The terminology used herein is for describing various examples only, and is not to be used to limit the disclosure. The articles "a," "an," and "the" are intended to include the plural forms as well, unless the context clearly indicates otherwise. The terms "comprises," "includes," and "has" specify the presence of stated features, numbers, operations, members, elements, and/or combinations thereof, but do not preclude the presence or addition of one or more other features, numbers, operations, members, elements, and/or combinations thereof.

Due to manufacturing techniques and/or tolerances, variations of the shapes shown in the drawings may occur. Thus, the examples described herein are not limited to the specific shapes shown in the drawings, but include changes in shape that occur during manufacturing.

Herein, it is noted that use of the term "may" with respect to an example, for example, as to what an example may include or implement, means that at least one example exists in which such a feature is included or implemented while all examples are not limited thereto.

The features of the examples described herein may be combined in various ways as will be apparent after an understanding of this disclosure. Further, although the examples described herein have a variety of configurations, other configurations are possible as will be apparent after an understanding of this disclosure.

Herein, a touch or a touch application may include a contact touch, while a force touch accompanies a pressing force of sufficient strength (pressure). For example, a contact may be determined without consideration of the force or may be a contact that does not accompany a substantive or sufficient force. As another example, a touch input generating an input signal in an electronic device may include a contact touch input generating contact touch input signal in a capacitive sensing manner and a force touch input generating an input signal in an inductive sensing manner.

Here, the touch input may refer only to a 'normal' or true touch for which an input signal may be generated for enabling the electronic device to be operated for one or more specific functions of the electronic device, and thus, may include excluding a touch that may be applied in error, e.g., when not a user's intention, among touches applied to a touch switch portion.

In addition, in one or more examples, the contact touch input and the force touch input may be simultaneously sensed or sensed at the same time in the electronic device in response to a single touch operation applied by the user. That is, when the user generates external pressure on the touch switch portion of the electronic device by applying a touch, the contact touch and the force touch on the touch switch portion may be simultaneously achieved, for example.

Accordingly, in various examples, a touch sensing module may include a pad sensing a contact touch and a sensing coil sensing a force touch together. In this case, the touch sensing module may perform hybrid sensing by which both capacitive sensing and inductive sensing may be achieved.

An aspect of the present disclosure is to provide a touch sensing module having improved touch sensing and an electronic device including the same.

Touch Sensing Module and Electronic Device Including the Same

FIG. 1 is a perspective view illustrating an exterior of an electronic device according to an embodiment.

The housing 500 may correspond to a means for covering at least a partial area of the electronic device 10, and at the same time, may be formed to be integrated with a means for forming a central skeleton of the electronic device 10. The housing 500 may be formed of a conductive or non-conductive material depending on the type and configuration of the electronic device 10.

The front display glass 52 may be disposed on one side of the housing 500, and the rear cover 53 may be disposed on the other side of the housing 500. For example, the electronic device 10 may include a side surface having a two-layer or three-layer structure including the front display glass 52, the housing 500, and the rear cover 53.

The touch switch portion TSW may be formed on a side surface of the electronic device 10 to replace mechanical buttons. The touch switch portion TSW may correspond to a portion of the side surface through which a touch input is transferred, for example, a contact surface to which pressure may be applied by a user's hand. Also, referring to FIG. 1, the touch switch portion TSW may correspond to at least a partial area of the housing 500.

The electronic device 10 may be a portable device such as a smartphone or a wearable device such as a smartwatch, but is not limited thereto, and examples include various portable or wearable electronic devices, as well as other electronic devices having switches for controlling operations.

For example, the electronic device 10 may be a smartphone, a personal digital assistant (PDA), a digital video camera, a digital still camera, a network system, a personal computer (PC), a monitor, a tablet PC, a laptop PC, a net-book PC, a television, a video game machine, a smartwatch, or an automotive, but examples are not limited thereto.

Figure 2A:
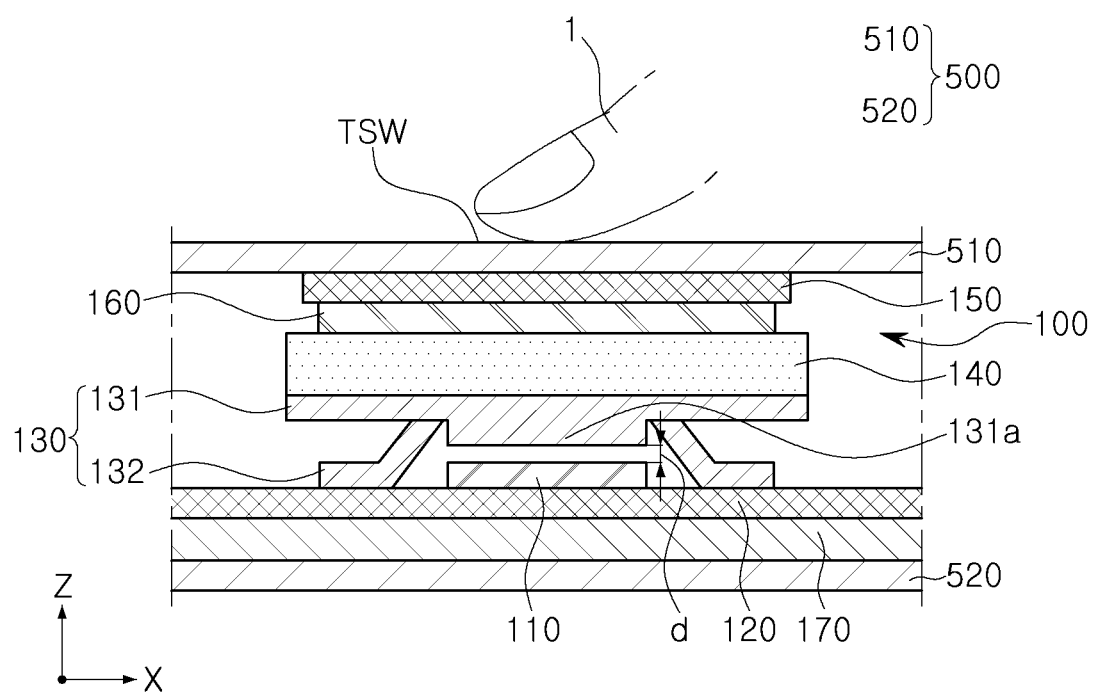
FIGS. 2A and 2B are front views taken in an X-Z direction, illustrating an example in which a touch sensing module is installed inside the electronic device of FIG. 1.
Figure 2B:
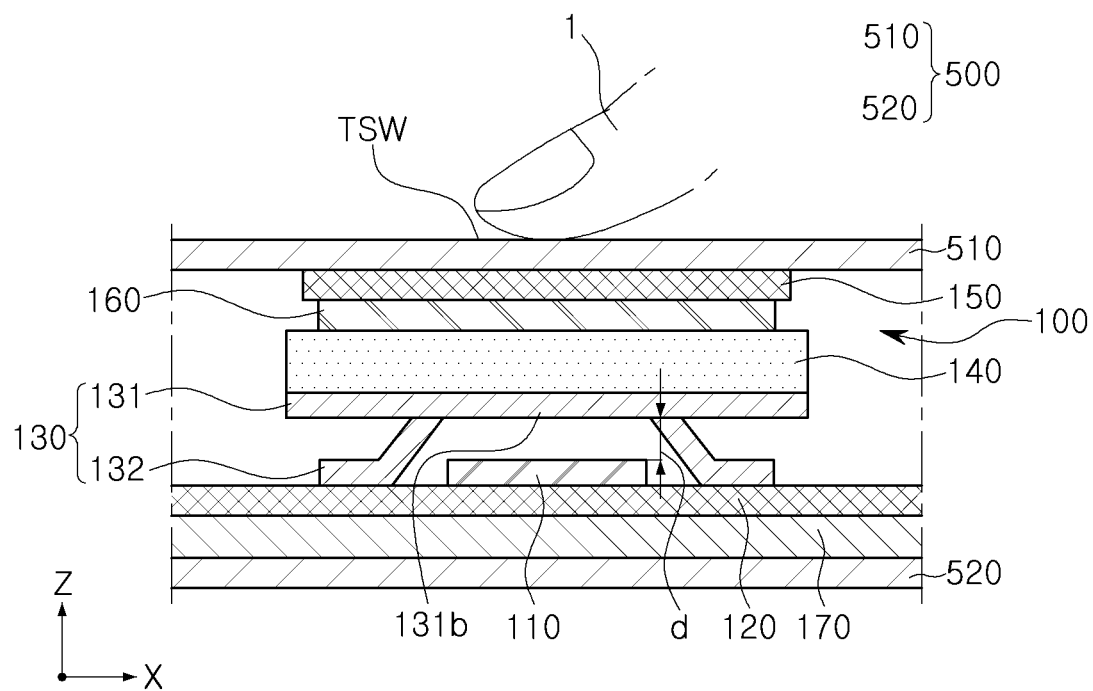
Figure 3:
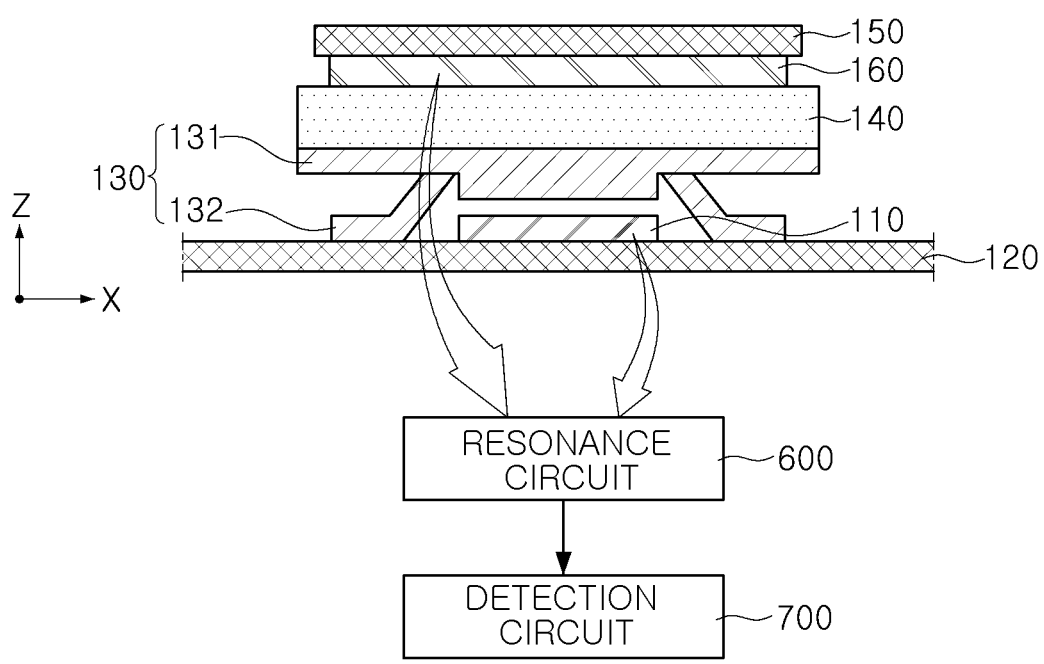
FIG. 3 illustrates both a front view of the touch sensing module of FIG. 2A taken in an X-Z direction and a connection structure of a circuit.

FIGS. 2A and 2B are front views taken in an X-Z direction, illustrating an example in which a touch sensing module is installed inside the electronic device of FIG. 1, and FIG. 3 illustrates both a front view of the touch sensing module of FIG. 2A taken in an X-Z direction and a connection structure of a circuit.

Referring to FIGS. 1 to 3, the electronic device 10 may include a touch sensing module 100 sensing a touch applied to the touch switch portion TSW of the housing 500. For example, the touch sensing module 100 may be installed in such a manner that way that it is inserted into the electronic device 10.

Referring to FIGS. 2A and 2B, the electronic device 10 according to an embodiment may include a housing 500, and the housing 500 includes an outer housing 510 and an inner housing 520.

The outer housing 510 may correspond to an outwardly exposed portion of the electronic device 10, and may include a touch switch portion TSW to which a user's touch may be applied. The inner housing 520 may correspond to a portion maintaining the skeleton inside the electronic device 10, and may be spaced apart from the outer housing 510.

The touch sensing module 100 according to an embodiment may be disposed between the outer housing 510 and the inner housing 520.

Referring to FIGS. 2A and 2B as well as FIG. 3, the touch sensing module 100 according to an embodiment may include a sensing coil 110, a first substrate 120, and a metal portion 130, a first bracket 140, a second substrate 150, and a pad 160.

The sensing coil 110 may be spaced apart from the outer housing 510, and may be spaced apart from the metal portion 130 by a predetermined distance 'd' while opposing the metal portion 130. As a touch is applied to the touch switch portion TSW by the user's hand 1, the metal portion 130 may move in a direction toward the sensing coil 110, and the spacing distance 'd' between the metal portion 130 and the sensing coil 110 may be decreased.

In this case, current may flow through the sensing coil 110, and a magnitude of eddy current may change due to the change in the distance between the sensing coil 110 and the metal portion 130, a conductor, around the sensing coil 110. Due to the changed eddy current, and inductance of the sensing coil 110 may be increased or decreased (L±ΔL). By sensing the change in inductance, the touch sensing module 100 may perform inductive sensing to determine whether a touch input is applied.

For example, the sensing coil 110 and the metal portion 130 are portions which may perform 'inductive sensing' in the electronic device 10 to sense a force touch input.

The sensing coil 110 may correspond to a wound-type coil, and a shape thereof is not limited to any particular form. For example, the sensing coil 110 may be formed in various shapes such as a square, a circle, or a track shape. In addition, the sensing coil 110 may have a structure resulting from a forming of a wiring pattern on a printed circuit board (PCB) or a flexible printed circuit board (FPCB) or by providing a chip inductor, for example.

Figure 7:
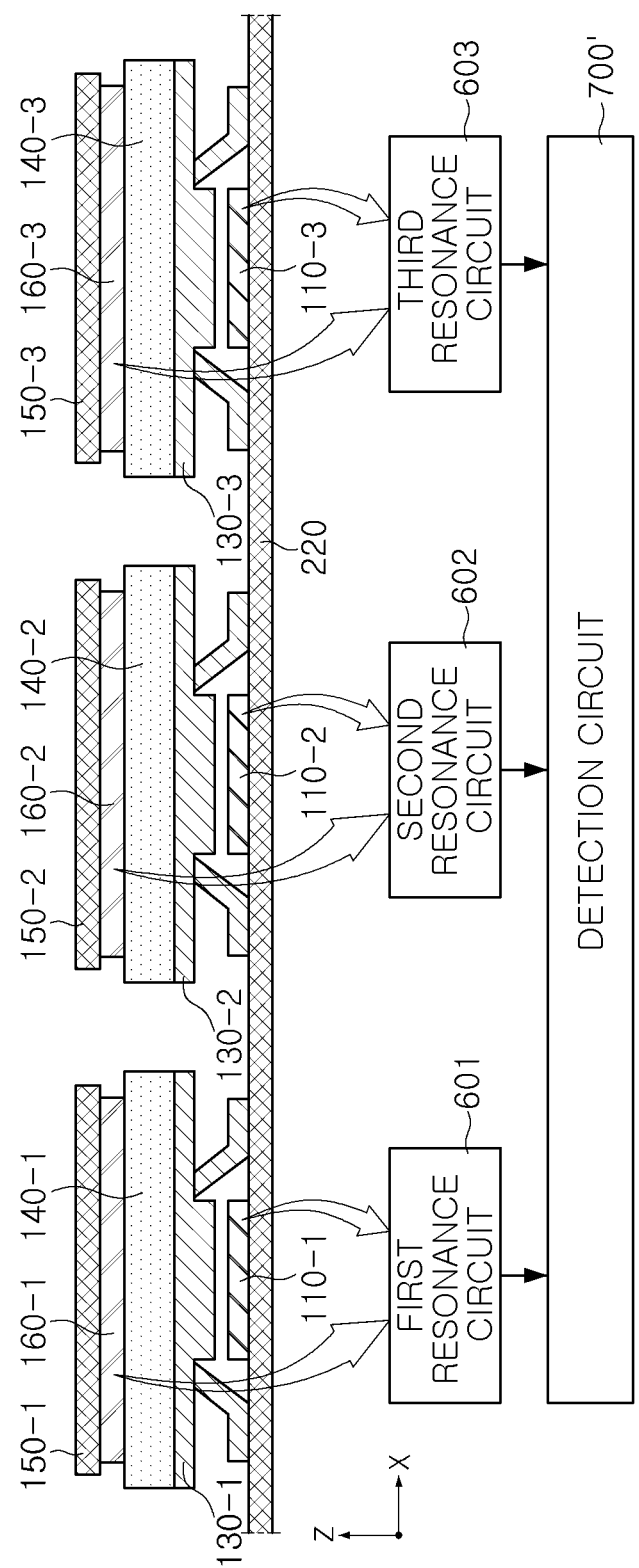
FIG. 7 is a view illustrating both a front view of an example of the touch sensing module of FIG. 6 taken in an X-Z direction and an example of a connection structure of a circuit.

The first substrate 120 has an area in which the sensing coil 110 is disposed, and may be supported by a second bracket 170. The first substrate 120 may have a structure in contact with a portion of the metal portion 130 as illustrated in FIGS. 2A and 2B, or may have a structure spaced apart from metal portions 130-1, 130-2, and 130-3 without having a portion in contact with the metal portions 130-1, 130-2, and 130-3 as illustrated in FIG. 7 to be described later.

The first substrate 120 may correspond to an FPCB, but examples are not limited thereto. For example, the first substrate 120 may be various types of substrate having a structure, in which at least one metal layer and at least one wiring layer are alternately stacked, other than the FPCB.

The metal portion 130 may be disposed between the outer housing 510 and the sensing coil 110, and may be spaced apart from the sensing coil 110 by a predetermined distance 'd.'

The metal portion 130 may move in a direction toward the sensing coil 110 as a touch is applied to the touch switch portion TSW. The metal portion 130 may serve to induce a change in inductance of the sensing coil 110 as the separation distance 'd' between the sensing coil 110 and the metal portion 130 is decreased.

As illustrated in FIGS. 2A and 2B and FIG. 3, the metal portion 130 according to an embodiment may have a portion in contact with the first substrate 120 and another portion is in contact with the first bracket 140.

More specifically, the metal portion 130 may include a connection portion 131 in contact with the first bracket 140 and a pressurization portion 132 extending from the connection portion 131 toward the inner housing 520 and deformed as a touch is applied. One end of the pressurization portion 132 may be connected to the connection portion 131, and the other end may be connected to the first substrate 120.

A specific shape of the pressurization portion 132 may vary and may be, for example, a bent shape as illustrated in FIGS. 2A and 2B and FIG. 3. As a touch is applied to the touch switch portion TSW, a pressure caused by the touch may also be transferred to the connection portion 131 and the pressurization portion 132, and the pressurization portion 132 may be deformed by the pressure in a direction in which a slope becomes gentle. For example, in FIGS. 2A and 2B, a downwardly applied pressure may cause a pair of pressurization portions 132, provided in the metal portion 130, to be deformed in a shape of spreading to both sides in an X-direction. In this case, the entire metal portion 130 including the connection portion 131 may descend toward the sensing coil 110.

Referring to FIG. 2A, the metal portion 130 may further include a sensing region 131a protruding, in a direction in which the sensing coil 110 is disposed, and overlapping a winding surface of the sensing coil 110. As the metal portion 130 descends toward the sensing coil 110, the separation distance 'd' between the sensing region 131a and the sensing coil 110 may be decreased, as compared with before the touch is applied. The inductance of the sensing coil 110 may change as the sensing region 131a of the metal portion 130 moves in a direction to the sensing coil 110.

On the other hand, referring to FIG. 2B, the metal portion 130 does not include a sensing region protruding in a direction in which the sensing coil 110 is disposed, but may include a sensing region 131b overlapping a winding surface of a sensing coil 110. Even when the following description is provided with reference to FIG. 2A, the present disclosure is not limited thereto.

In FIG. 2A and FIG. 3, the sensing region 131a is illustrated as protruding from the connection portion 131 while having a width similar to a width of the sensing coil 110, but a shape of the sensing region 131a is not limited thereto. For example, the sensing region 131a may not have a protruding shape, and may refer to a central portion of the connection portion 131 in which the connection portion 131 and the sensing coil 110 overlap each other. The sensing region 131a may be wider or narrower than the sensing coil 110.

The metal portion 130 may serve to support the structure of the touch sensing module 100 together with the second bracket 170. For example, the metal portion 130 and the second bracket 170 may be structured to be coupled to each other. Accordingly, a separation distance 'd' between the sensing coil 110 and the sensing region 131a or 131b disposed between the metal portion 130 and the second bracket 170 may be maintained to be constant.

The first bracket 140 may be disposed between the outer housing 510 and the metal portion 130. The metal portion 130 may be disposed on one surface of the first bracket 140, and the pad 160 may be disposed on the other surface facing the one surface. More specifically, the metal portion 130 may be disposed on one surface toward the inner housing 520 and the pad 160 is disposed on the other surface toward the outer housing 510, among opposing surfaces of the first bracket 140.

The first bracket 140 may serve to support the structure of the touch sensing module 100 together with the second bracket 170. For example, the first bracket 140 and the second bracket 170 may be structured to be coupled to each other. Accordingly, a separation distance 'd' between the sensing coil 110 and the metal portion 130 disposed between the first and second brackets 140 and 170 may be maintained to be constant.

The first bracket 140 may descend together with the metal portion 130 as a touch is applied to the touch switch portion TSW to deform the pressurization portion 132.

A specific shape of the first bracket 140 may vary. For example, as illustrated in FIGS. 2A and 2B and FIG. 3, the first bracket 140 may have a shape of a plate having a width similar to that of the connection portion 131 of the metal portion 130. Unlike the second bracket 170 to be described later, a separated structure may appear between respective first brackets 140, included in an individual touch sensing module 100, without being bonded to each other.

A material of the first bracket 140 is not limited to a special material, but may be a non-conductor such as plastic. In this case, the first bracket 140 may not only serve to physically separate the pad 160 and the metal portion 130 from each other, but also serve to electrically separate the pad 160 and the metal portion 130 from each other.

The metal portion 130 and the first bracket 140 may be attached to each other after being provided in units of separate components, or may be provided in a single component unit using a method such as an insert molding method.

The second substrate 150 may have an area in which the pad 160 is disposed.

The second substrate 150 may be disposed between the outer housing 510 and the pad 160 as illustrated in FIGS. 2A and 2B. However, the disposition of the second substrate 150 is not limited thereto, and the second substrate 150 may be disposed between the pad 160 and the first bracket 140 as long as it has an area in which the pad 160 is disposed.

The second substrate 150 may correspond to an FPCB, but examples are not limited thereto. For example, the second substrate 150 may employ any type of substrate, having a structure in which at least one metal layer and at least one wiring layer are alternately stacked, other than the FPCB.

The first and second substrates 120 and 150 may be connected to each other to form a single substrate. For example, the first and second substrates 120 and 150 may be integrated with each other as an entire substrate on which the sensing coil 110 and the pad 160 are mounted, and a partial region of the substrate may be bent to be implemented as the first and second substrates 120 and 150. Accordingly, the sensing coil 110 and the pad 160 may be mounted together on the same surface of the integrated substrate.

The pad 160 may be disposed between the outer housing 510 and the first bracket 140, and may have capacitance varying as a touch is applied.

The pad 160 may correspond to a device performing capacitive sensing for sensing a contact touch to generate an input signal. Accordingly, a touch sensing module provided with the sensing coil 110 and the pad 160 together may perform hybrid sensing in which inductive sensing and capacitive sensing are simultaneously performed.

The pad 160 may be disposed adjacent to the outer housing 510 of the electronic device 10 to detect a change in capacitance as an external contact is applied to the touch switch portion TSW. In this case, the pad 140 and the sensing coil 110 may be disposed on the same vertical line, a force touch and a contact touch may be simultaneously sensed by a single touch operation.

Referring to FIG. 3, the sensing coil 110 and the pad 160 may be electrically connected to each other to form a resonance circuit 600. In addition, the resonance circuit 600 including the sensing coil 110 and the pad 160 may be connected to a detection circuit 700.

The resonance circuit 600 may generate a resonance signal having a resonant frequency varying as a touch is applied. A change in resonant frequency may be induced by a change in inductance generated in the sensing coil 110, and may also be induced by a change in capacitance occurring in the pad 160. Accordingly, the resonance circuit 600 may generate a resonance signal in which the resonant frequency varies when at least one of inductance and capacitance varies.

The resonance signal generated by the resonance circuit 600 may be transmitted to the detection circuit 700. The detection circuit 700 may be electrically connected to the resonance circuit 600, and may generate a touch input signal based on the amount of a change in a resonant frequency of the generated resonance signal.

Hereinafter, a series of variations, occurring as a touch is applied to the electronic device 10 according to an embodiment, will be described in more detail.

When a user applies a touch to the touch switch portion TSW, a contact touch and a force touch accompanying a pressure may be generated together.

The contact touch may be transferred to the pad 160, and the pad 160 may cause a variation capacitance as a result of a change in a contact medium depending on the touch applied to the touch switch portion TSW.

In this case, the change in capacitance generated in the pad 160 may induce a change in the resonant frequency of the resonance signal generated by the resonance circuit 600, and the detection circuit 700 may detect a position to which a touch is applied (hereinafter referred to as a "touch-applied position"), based on the change in the resonant frequency. In addition, the detection circuit 700 may generate a contact touch input signal including information on the detected position.

The term "touch-applied position" may refer to, for example, a specific position, to which a touch is applied by a user's hand, in a region constituting a contact surface of the pad 160. That is, the touch-applied position may be a conceptual position for distinguishing whether the contact touch is applied to a central portion of the contact surface of the pad 140 or a peripheral portion of the contact surface of the pad 140.

In this case, when the user's hand touches the peripheral portion of the contact surface of the pad 160, the detection circuit 700 may recognize the touch as a user's unintentional touch. Meanwhile, when the user's hand touches the pad 160 including the central portion of the contact surface, the detection circuit 700 may recognize the touch as a user's intentional normal touch.

However, this is only an example. Therefore, the detection circuit 700 may distinguish and recognize a touch in various ways depending on a specific position, to which a contact touch is applied by the user's hand, in a region constituting the contact surface of the pad 160.

As another example, the term "touch-applied position" may refer to what touch sensing module the contact touch is applied, among a plurality of touch sensing modules included in the electronic device 10. That is, when the electronic device 10 includes a plurality of touch sensing modules, a single touch switch portion TSW and a single pad 160 may be disposed in each of the touch sensing modules. In this case, the touch-applied position may be a conceptual position for distinguishing what touch switch portion the user's hand is in contact with, among a plurality of touch switch portions.

The detection circuit 700 may detect a pad in which a change in capacitance occurs, among a plurality of pads, to determine what touch switch portion the user's hand is in contact with. In this case, the detection circuit 700 may detect a change in inductance of a touch sensing module corresponding to the determined touch switch portion, and thus, may determine the intensity of pressure generated by a touch to perform hybrid sensing.

The force touch, generated as the user applies a touch to the touch switch portion TSW, may descend the metal portion 130. For example, in the case of the metal portion 130 illustrated in FIGS. 2A and 2B, the pressurization portion 132 may be deformed to descend. Then, a sensing region 131*a* of the metal portion 130 may approach the sensing coil 110.

As the metal portion 130 approaches the sensing coil 110 through which current flows, inductance may change in the sensing coil 110 due to generation of an eddy current. For example, the sensing coil 110 may have an inductance varying depending on a separation distance between the sensing coil 110 and the metal portion 130.

In addition, the change in inductance of the sensing coil 110 may induce a change in the resonant frequency of the resonance signal generated by the resonance circuit 600, and the detection circuit 700 may detect the intensity of a pressure generated by a touch, based on the change in the resonant frequency depending on the change in inductance of the sensing coil 110. In addition, the detection circuit 700 may generate a force touch input signal matching the detected intensity of the pressure.

The detection circuit 700 may determine whether intensity of a pressure applied to the touch switch portion TSW is greater than a threshold, and thus, may detect only a touch, having a pressure greater than the threshold, as a normal touch input. When it is determined that a normal touch input is applied, a corresponding touch input signal may be generated.

More specifically, in the touch sensing apparatus 100, a threshold may be set to determine a normal touch input, among a plurality of touches applied to the touch switch portion TSW.

For example, when the user applies a touch of relatively high pressure to the touch switch portion TSW, a relatively large change in resonant frequency may occur and a value of the variation may be greater than a preset threshold. Then, the touch of relatively high pressure applied by the user may generate a force touch input signal.

On the other hand, when the user applies a touch having relatively low pressure to the touch switch portion TSW, a separation distance between the sensing coil 110 and the metal portion 130 may be slightly changed, as compared with before the touch is applied. Then, the amount of change in inductance measured by the sensing coil 110 and the amount of change in resonant frequency of the resonance signal generated accordingly are not large, and thus, may not be greater than the preset threshold value. That is, since the touch having relatively low pressure applied by the user does not reach a level in which an input signal is generated, the touch having relatively low pressure may be determined as a malfunction rather than a normal touch input.

In addition, as the touch sensing module 100 is provided with the pad 160 sensing a contact touch, an accurate position, in which the user's touch operation is performed, of the housing 500 may be identified. For example, when a change in capacitance generated by the pad 160 is detected, the touch sensing module 100 may recognize that a touch is applied to the touch switch portion TSW in which the change is detected.

In addition, under the assumption that a touch is applied to the corresponding touch switch portion TSW, a change in inductance generated in the sensing coil 110 may be detected to determine the intensity of a pressure generated by a touch.

In other words, the touch sensing apparatus 100 may detect a touch-applied position with capacitive sensing and may detect the intensity of a pressure of a touch with inductive sensing, and thus, may generate a corresponding touch input signal.

However, since the above-described method is only an example, the detection circuit 700 may generate a touch input signal through various determining operations, depending on a disposition and a connection relationship of a plurality of sensing coils 110 and pads 160 included in the electronic device 10.

Referring to FIGS. 2A and 2B and FIG. 3, the touch switch portion TSW, the pad 160, and the sensing coil 110 may be disposed such that at least some regions overlap each other. Accordingly, a single touch applied to the touch switch portion TSW may be transferred to both the pad 160 and the sensing coil 110.

For example, a winding axis of the sensing coil 110 and a central axis of the contact surface of the pad 160 may match each other. In this case, a center of the touch switch portion TSW included in the outer housing 510 may also be disposed to match the winding axis of the sensing coil 110.

In this case, a force touch and a contact touch may be simultaneously applied to the sensing coil 110 and the pad 160 by a single touch applied to the touch switch portion TSW by the user, respectively. For example, centers of the touch switch portion TSW, the sensing coil 110, and the pad 160 may be disposed to match each other, allowing the electronic device 10 according to the present disclosure to perform hybrid sensing more accurately.

As illustrated in FIGS. 2A and 2B, the touch sensing module 100 according to an embodiment may further include a second bracket 170.

The second bracket 170 may be disposed between the first substrate 120 and the inner housing 520 to support the first substrate 120.

A specific shape of the second bracket 170 may vary and may be, for example, a plate shape parallel to the inner housing 520. Unlike the above-described first bracket 140, even when a plurality of touch sensing modules 100 are provided, the second bracket 170 may be structured to simultaneously support the plurality of metal portions 130 and the first bracket 140 while being integrated therewith without being separated therefrom.

The second bracket 170 is not limited to a special material, and may be formed of a non-conductor such as plastic or a conductor such as metal.

The second bracket 170 may serve to support the structure of the touch sensing module 100 together with the first bracket 140. For example, the first bracket 140 and the second bracket 170 may be structured coupled to each other. Accordingly, a separation distance 'd' between the sensing coil 110 and the metal portion 130 disposed between the first and second brackets 140 and 170 may be maintained to be constant.

In addition, the second bracket 170 may serve to support one or a plurality of touch sensing modules 100 to be seated in an internal space of the electronic device 10.

Figure 4:
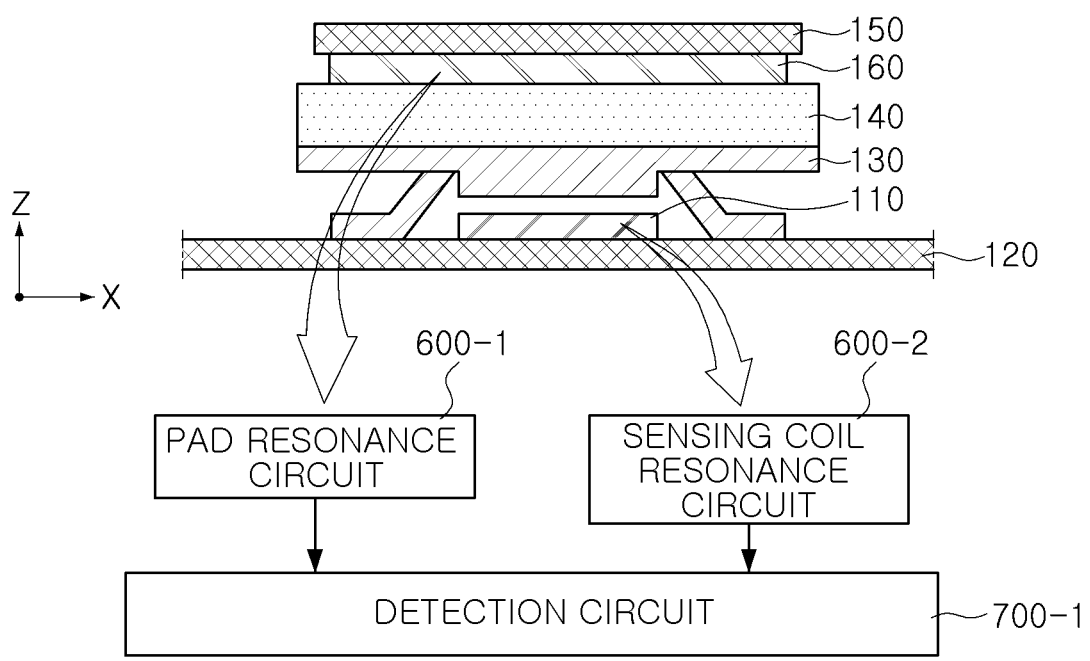
FIG. 4 is a view illustrating both a front view of another example of the touch sensing module of FIG. 2A taken in an X-Z direction and another example of a connection structure of a circuit.

Referring to FIG. 3, for example, the touch sensing module 100 may comprise a pad 160, a first bracket 140, a metal portion 130, and a sensing coil 110 facing and spaced apart from the metal portion 130, disposed in this order in a touch direction, wherein the pad 160 comprises a capacitance configured to vary in response to a touch. The touch direction may be a direction in which a touch is applied. For example, the touch direction may be a direction from the outer housing 510 toward the inner housing 520. FIG. 4 is a view illustrating both a front view of another example of the touch sensing module of FIG. 2A taken in an X-Z direction and another example of a connection structure of a circuit. That is, the touch sensing module may have a circuit connection structure in a manner different from that of FIG. 3.

Referring to FIG. 4, a pad 160 may constitute a pad resonance circuit 600-1, and the sensing coil 110 may constitute a sensing coil resonance circuit 600-2. For example, the pad 160 and the sensing coil 110 included in a single touch sensing module may constitute separate resonance circuits.

Each of the pad resonance circuit 600-1 and the sensing coil resonance circuit 600-2 may be connected to the detection circuit 700-1. In the present disclosure, a description has been provided as to only a structure in which the pad resonance circuit 600-1 and the sensing coil resonance circuit 600-2 are simultaneously connected to a single detection circuit 700-1. However, the present disclosure is not limited thereto, and may employ a structure in which the pad resonance circuit 600-1 and the sensing coil resonance circuit 600-2 are connected to separate detection circuits.

The pad resonant circuit 600-1 may generate a first resonant signal having a resonant frequency varying as a touch is applied. For example, when a change in capacitance occurs in the pad 160 as a touch is applied, a change in resonant frequency of the pad resonant circuit 600-1 may be induced. Then, a first resonance signal may be generated based on the changed resonant frequency.

The sensing coil resonant circuit 600-2 may generate a second resonant signal having a resonant frequency varying as a touch is applied. For example, when a change in inductance occurs in the sensing coil 110 as a touch is applied, a change in resonant frequency of the sensing coil resonance circuit 600-2 may be induced. Then, a second resonance signal may be generated based on the changed resonant frequency.

The first and second resonance signals, respectively generated by the plurality of resonance circuits 600-1 and 600-2, may be transmitted to a detection circuit 700-1. The detection circuit 700-1 may be electrically connected to the plurality of resonance circuits 600-1 and 600-2, and may generate a touch input signal based on the amount of change in the resonant frequency of the generated first and second resonance signals.

More specifically, the detection circuit 700-1 may be electrically connected to the pad resonance circuit 600-1. In addition, the detection circuit 700-1 may recognize a contact touch applied to the pad 160-1 based on the amount of change in the resonant frequency of the first resonance signal generated in the pad resonance circuit 600-1, and thus, may generate a contact touch input signal.

The detection circuit 700-1 may be electrically connected to the sensing coil resonance circuit 600-2. The detection circuit 700-1 may recognize a force touch having a pressure applied to the sensing coil 110 based on the amount of change in resonant frequency of the second resonance signal generated in the sensing coil resonance circuit 600-2, and thus, may generate a force touch input signal.

In other words, when a single touch is applied to the touch switch portion by the user, the touch may act as a contact touch to the pad 160 as well as a force touch to the sensing coil 110. In addition, the contact touch and the force touch may generate separate touch input signals, for example, a contact touch input signal and a force touch input signal in the detection circuit 700-1, respectively.

A portion of the pad resonance circuit 600-1 and the sensing coil resonance circuit 600-2 and the detection circuit 700-1 may be included in a sensor integrated circuit (IC). A plurality of capacitors may be provided in the sensor IC. Each of the plurality of capacitors may be a portion constituting a resonant circuit.

For example, the pad resonance circuit 600-1 may include a pad 160, and may be configured to further include a separate inductor and a single capacitor included in the sensor IC. In this case, a method of implementing the separate inductor may be various and, as an example, the separate inductor may be implemented as a chip inductor inside the touch sensing module.

The chip inductor and the single capacitor, included in the sensor IC, may act as a single resonator generating a resonance signal and may be connected to the pad 160 to generate a first resonance signal, based on the amount of change in the resonant frequency depending on a change in capacitance of the pad 160.

The sensing coil resonance circuit 600-2 may include a sensing coil 110, and may be configured to further include a single capacitor included in the sensor IC. The sensing coil 110 and the single capacitor, included in the sensor IC, may act as a single resonator generating a resonance signal, and a second resonance signal is generated based on the amount of change in a resonant frequency depending on the change in inductance of the sensing coil 110.

However, the above-described methods of configurating the resonance circuits are only an example, and the resonance circuit may be configured in various manners to be connected to the detection circuit 700-1. In addition, the configuration of the sensor IC may also be modified in various manners.

Figure 5:
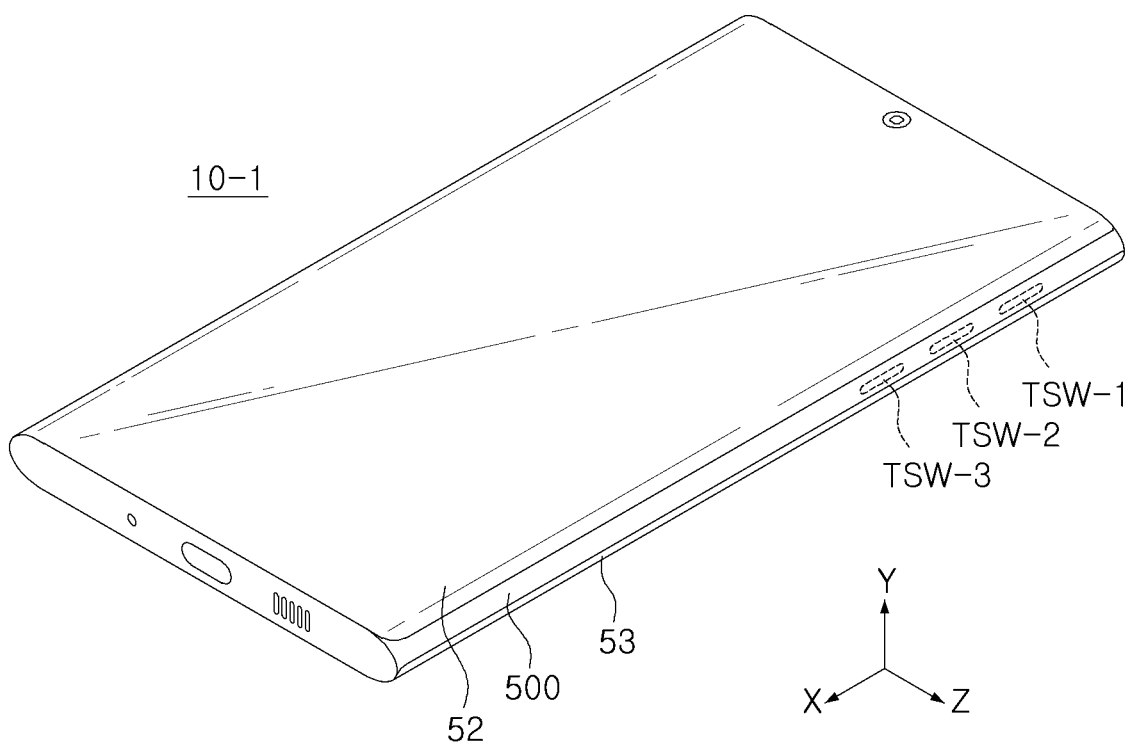
FIG. 5 is a perspective view illustrating an exterior of an electronic device according to another embodiment.
Figure 6:
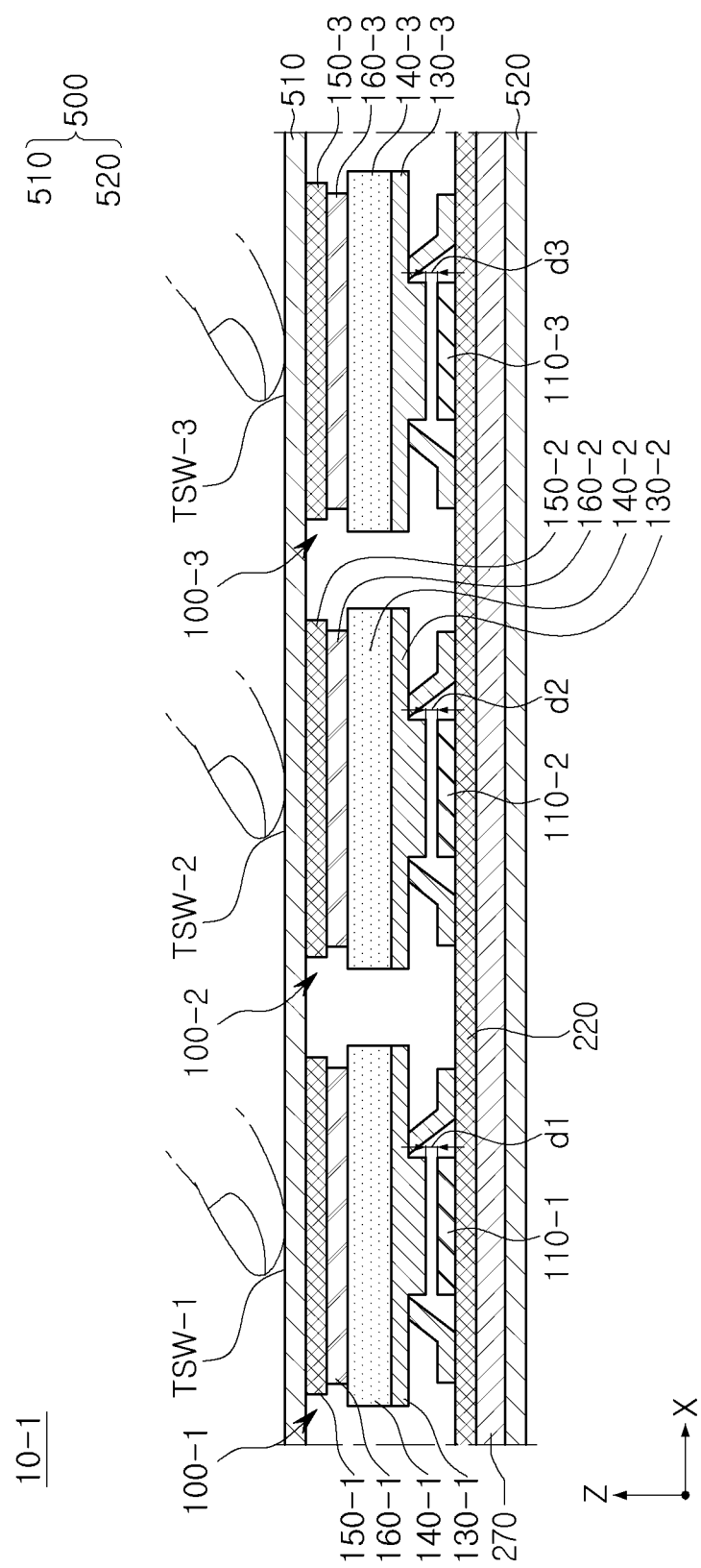
FIG. 6 is a front view taken in an X-Z direction, illustrating an example in which a sensing module is installed inside the electronic device of FIG. 5.

FIG. 5 is a perspective view illustrating an exterior of an electronic device according to another embodiment, FIG. 6 is a front view taken in an X-Z direction, illustrating an example in which a sensing module is installed inside the electronic device of FIG. 5, and FIG. 7 is a view illustrating both a front view of an example of the touch sensing module of FIG. 6 taken in an X-Z direction and an example of a connection structure of a circuit.

Referring to FIGS. 5 to 7, an electronic device 10-1 according to the present embodiment may include a plurality of touch sensing modules 100-1, 100-2, and 100-3. For reference, FIGS. 5 and 6 illustrate only an example in which three touch sensing modules are included in the electronic device 10-1, but various numbers of touch sensing modules such as two touch sensing modules or four or more touch sensing modules may be included, as necessary.

The electronic device 10-1 according to the present embodiment may include a plurality of touch switch portions TSW-1, TSW-2, and TSW-3, respectively corresponding to the plurality of touch sensing modules 100-1, 100-2, and 100-3.

In general, the plurality of touch sensing modules 100-1, 100-2, and 100-3 may correspond to different touch switch portions TSW-1, TSW-2, and TSW-3 to perform separate button functions, respectively. However, each of a plurality of touch sensing modules may correspond to a single touch switch portion to perform a function of improving sensitivity of a sensor.

A plurality of sensing coils 110-1, 110-2, and 110-3 and a plurality of pads 160-1, 160-2, and 160-3 may be disposed in the electronic device 10-1 according to the present embodiment. In this case, the plurality of sensing coils 110-1, 110-2, and 110-3 may be disposed to respectively face a plurality of metal portions 130-1, 130-2, and 130-3 formed to be separated from each other. The plurality of pads 160-1, 160-2, and 160-3 may be respectively supported by a plurality of first brackets 140-1, 140-2, and 140-3 formed to be separated from each other.

The plurality of pads 160-1, 160-2, and 160-3 may match the sensing coils 110-1, 110-2, and 110-3 in a one-to-one manner to be disposed to respectively overlap the sensing coils 110-1, 110-2, and 110-3. In addition, each pad, and each sensing coil, matching in the one-to-one manner, may match different touch switch portions in a one-to-one manner to constitute a separate switch.

In this case, the electronic device 10-1 may detect a touch switch portion, to which a touch is applied, among the plurality of touch switch portions TSW-1, TSW-2, and TSW-3, based on a change in a resonant frequency depending on a change in capacitance, and may generate a contact touch input signal matching the detected touch switch portion.

A plurality of metal portions 130-1, 130-2, and 130-3 and a plurality of first brackets 140-1, 140-2, and 140-3 according to the present embodiment may have horizontal widths, respectively limited to predetermined lengths, as illustrated in FIGS. 6 and 7.

For example, the metal portions 130-1, 130-2, and 130-3, included in the plurality of touch sensing modules 100-1, 100-2, and 100-3, may be formed to be separated from each other without being connected to each other. In addition, the first brackets 140-1, 140-2, and 140-3, included in the plurality of touch sensing modules 100-1, 100-2, and 100-3, may be formed to be separated from each other without being connected to each other.

As described above, each metal portion and each first bracket, included in different touch sensing modules, may be formed to not be integrated with each other but to be separated from each other, so that a pressure generated by a touch applied to a single touch switch portion may be intensively transferred to a single sensing coil. Accordingly, an effect of a touch, applied by a user, on adjacent touch sensing modules may be significantly reduced. Thus, a malfunction of force sensing may be reduced.

In addition, according to the present embodiment, the plurality of metal portions 130-1, 130-2, and 130-3 may have shape, respectively surrounding the sensing coils 110-1, 110-2, and 110-3, as illustrated in FIGS. 6 and 7. Accordingly, signals are cut off between the respective sensing coils 110-1, 110-2, and 110-3 to reduce a malfunction caused by signal interference and noise between different touch sensors.

Referring to FIGS. 6 and 7 together, the touch sensing module 100-1 according to the present embodiment may include a sensing coil 110-1, a metal portion 130-1, a first bracket 140-1, a second substrate 150-1, and a pad 160-1.

The sensing coil 110-1 may be spaced apart from the outer housing 510, and may be spaced apart from the metal portion 130-1 by a predetermined distance d1 while facing the metal portion 130-1. As a touch is applied to the touch switch portion TSW-1 by a user's hand 1, the metal portion 130-1 may approach the sensing coil 110-1 and the separation distance d1 between the metal portion 130-1 and the sensing coil 110-1 may be decreased.

The sensing coil 110-2 may be spaced apart from the outer housing 510, and may be spaced apart from the metal portion 130-2 by a predetermined distance d2 while facing the metal portion 130-2. As a touch is applied to the touch switch portion TSW-2 by a user's hand 1, the metal portion 130-2 may approach the sensing coil 110-2 and the separation distance d2 between the metal portion 130-2 and the sensing coil 110-2 may be decreased.

The sensing coil 110-3 may be spaced apart from the outer housing 510, and may be spaced apart from the metal portion 130-3 by a predetermined distance d3 while facing the metal portion 130-3. As a touch is applied to the touch switch portion TSW-3 by a user's hand 1, the metal portion 130-3 may approach the sensing coil 110-3 and the separation distance d3 between the metal portion 130-3 and the sensing coil 110-3 may be decreased.

The sensing coils 110-1, 110-2, and 110-3 may correspond to a winding-type coil, and a shape thereof is not defined. For example, the coil may be formed in various shapes such as a rectangle, a circle, a track, and the like. In addition, the sensing coils 110-1, 110-2, and 110-3 may be implemented by forming a wiring pattern on a PCB or an FPCB, or by being provided with a chip inductor.

The metal portion 130-1 may be disposed between the outer housing 510 and the sensing coil 110-1, and may be spaced apart from the sensing coil 110-1 by a predetermined distance d1.

The metal portion 130-1 may move in a direction toward the sensing coil 110-1 as a touch is applied to the touch switch portion TSW-1. The metal portion 130-1 may serve to induce a change in inductance of the sensing coil 110-1 as the separation distance d1 between the sensing coil 110-1 and the metal portion 130-1 is decreased. For example, as a touch is applied to the touch switch portion TSW-1, the metal portion 130-1 may receive a pressure, generated by a touch, to be deformed, and the inductance of the sensing coil 110-1 may vary.

The metal portion 130-1 according to the present embodiment may have a portion in contact with the first substrate 220 and the other portion in contact with the first bracket 140-1, but a shape of the metal portion 130-1 is not limited thereto.

The first bracket 140-1 may be disposed between the outer housing 510 and the metal portion 130-1. The metal portion 130-1 may be disposed on one surface of the first bracket 140-1, and the pad 160-1 may be disposed on the other surface facing the one surface.

The first bracket 140-1 may serve to support the structure of the touch sensing module 100-1. The first bracket 140-1 may descend together with the metal portion 130-1 as the metal portion 130-1 is deformed by the touch applied to the touch switch portion TSW.

The first bracket 140-1 is not limited to a special material, but may be formed of a non-conductor such as plastic. In this case, the first bracket 140-1 may not only serve to physically separate the pad 160-1 and the metal portion 130-1 from each other, but also serve to electrically separate the pad 160-1 and the metal portion 130-1 from each other.

The second substrate 150-1 may have an area in which the pad 160-1 is disposed. The second substrate 150-1 may be disposed between the outer housing 510 and the pad 160-1. Alternatively, the second substrate 150-1 may be disposed between the first bracket 140-1 and the pad 160-1.

The second substrate 150-1 may correspond to an FPCB, but is not limited thereto. For example, the second substrate 150-1 may employ various types of substrate having a structure, in which at least one metal layer and at least one wiring layer are alternately stacked, other than the FPCB.

The second substrate 150-1 may be connected to the first substrate 220 to form a single substrate. For example, a partial region of the substrate may be bent to be implemented as the first substrate 220 and the plurality of second substrates 150-1, 150-2, and 150-3. Accordingly, the sensing coil 110-1 and the pad 160-1 may be mounted together on the same surface of the substrate integrated therewith.

The pad 160-1 may be disposed between the outer housing 510 and the first bracket 140-1, and may have capacitance varying as a touch is applied.

The pad 160-1 may be disposed adjacent to the outer housing 510 of the electronic device 10-1 to detect a change in capacitance when an external contact is applied to the touch switch portion TSW-1. In this case, the pad 160-1 and the sensing coil 110-1 may be disposed on the same vertical line, so that a force touch and a contact touch may be simultaneously detected by a single touch operation.

The touch sensing module 100-2 according to the present embodiment may include a sensing coil 110-2, a metal portion 130-2, a first bracket 140-2, a second substrate 150-2, and a pad 160-2. In addition, the touch sensing module 100-3 according to the present embodiment may include a sensing coil 110-3, a metal portion 130-3, a first bracket 140-3, a second substrate 150-3, and a pad 160-3.

Similarly to the touch sensing module 100-1, in response to touch applied to the touch switch portion TSW-2 by a user's hand 1, the metal portion 130-2 may approach the sensing coil 110-2 and the separation distance d2 between the metal portion 130-2 and the sensing coil 110-2 may be decreased, and/or in response to touch applied to the touch switch portion TSW-3 by a user's hand 1, the metal portion 130-3 may approach the sensing coil 110-3 and the separation distance d3 between the metal portion 130-3 and the sensing coil 110-3 may be decreased.

The above components may be the same as the sensing coil 110-1, the metal portion 130-1, the first bracket 140-1, the second substrate 150-1, and the pad 160-1 included in the touch sensing module 100-1, respectively. Thus, the overlapping descriptions of the details thereof will be omitted.

The electronic device 10-1 according to the present embodiment may include a single first substrate 220, as illustrated in FIGS. 6 and 7.

The first substrate 220 may have an area in which the plurality of sensing coils 110-1, 110-2, and 110-3 are disposed, and may be supported by the second bracket 270. For example, the first substrate 220 may be integrally formed to simultaneously support the plurality of touch sensing modules 100-1, 100-2, and 100-3. In this case, the first substrate 220 may be structured to be in contact with each of the plurality of metal portions 130-1, 130-2, and 130-3, as illustrated in FIG. 6.

The first substrate 220 may correspond to an FPCB, but is not limited thereto. For example, the first substrate 220 may employ various types of substrate having a structure, in which at least one metal layer and at least one wiring layer are alternately stacked, other than the FPCB.

As illustrated in FIG. 6, the electronic device 10-1 according to the present embodiment may further include a second bracket 270. The second bracket 270 may be disposed between the first substrate 220 and the inner housing 520 to support the first substrate 220.

A specific shape of the second bracket 270 may vary. For example, as illustrated in FIG. 6, the second bracket 270 may have a plate shape parallel to the inner housing 520. The second bracket 270 may have a structure simultaneously supporting a plurality of metal portions 130-1, 130-2, and 130-3 and the first brackets 140-1, 140-2, and 140-3 while being integrated therewith without being separated therefrom.

In this case, the second bracket 270 may have a structure coupled to the plurality of metal portions 130-1, 130-2, and 130-3 or the plurality of first bracket 140-1, 140-2, and 140-3 to support the plurality of touch sensing modules 100-1, 100-2, and 100-3.

The second bracket 270 is not limited to a special material, and may be formed of a non-conductor such as plastic or a conductor such as a metal.

The second bracket 270 may serve to support the plurality of touch sensing modules 100-1, 100-2, and 100-3 such that they may be seated in an internal space of the electronic device 10-1.

Referring to FIG. 7, the sensing coil 110-1 and the pad 160-1 may be electrically connected to each other to form a first resonance circuit 601, the sensing coil 110-2 and the pad 160-2 may be electrically connected to each other to form a second resonance circuit 602, and the sensing coil 110-3 and the pad 160-3 may be electrically connected to each other to form a third resonance circuit 603.

The first to third resonance circuits 601, 602, and 603 may be connected to a single detection circuit 700'.

The first resonance circuit 601 may generate a resonance signal having a resonant frequency varying as a touch is applied to the touch switch portion TSW-1. A change in the resonant frequency may be induced by a change in inductance occurring in the sensing coil 110-1, and a change in the resonant frequency may also be induced by a change in capacitance occurring in the pad 160-1. Accordingly, the first resonance circuit 601 may generate a resonant signal having a resonant frequency changed when at least one of the inductance and the capacitance is changed.

The resonance signal generated by the first resonance circuit 601 may be transmitted to the detection circuit 700'. The detection circuit 700' may be electrically connected to the first resonance circuit 601, and may generate a touch input signal based on the amount of change in the resonant frequency of the generated resonance signal.

The second resonance circuit 602 may generate a resonance signal having a resonant frequency varying as a touch is applied to the touch switch portion TSW-2. A change in the resonant frequency may be induced by a change in inductance occurring in the sensing coil 110-2, and a change in the resonant frequency may also be induced by a change in capacitance occurring in the pad 160-2. Accordingly, the second resonance circuit 602 may generate a resonance signal having a resonant frequency changed when at least one of the inductance and the capacitance is changed.

The resonance signal generated by the second resonance circuit 602 may be transmitted to the detection circuit 700'. The detection circuit 700' may be electrically connected to the second resonance circuit 602, and may generate a touch input signal based on the amount of change in the resonant frequency of the generated resonance signal.

The third resonance circuit 603 may generate a resonance signal having a resonant frequency varying as a touch is applied to the touch switch portion TSW-3. A change in the resonant frequency may be induced by a change in inductance occurring in the sensing coil 110-3, and a change in the resonant frequency may also be induced by a change in capacitance occurring in the pad 160-3. Accordingly, the third resonance circuit 603 may generate a resonance signal having a resonant frequency changed when at least one of the inductance and the capacitance is changed.

The resonance signal generated by the third resonance circuit 603 may be transmitted to the detection circuit 700'. The detection circuit 700' may be electrically connected to the third resonance circuit 603, and may generate a touch input signal based on the amount of change in the resonant frequency of the generated resonance signal.

When the change in the resonant frequency is detected by the change in the capacitance, the detection circuit 700' may determine what pad a change in capacitance occurred, among the plurality of pads 160-1, 160-2, and 160-3. Accordingly, the detection circuit 700' may determine which touch switch portion the user applied a touch, among the plurality of touch switch portions TSW-1, TSW-2, and TSW-3. The detection circuit 700' may generate a touch input signal corresponding to the touch switch portion to which the touch is applied.

Modified Embodiments

Hereinafter, a structure of a touch sensing module according to each modified embodiment illustrated in FIGS. 8 to 10 will be described.

Figure 8:
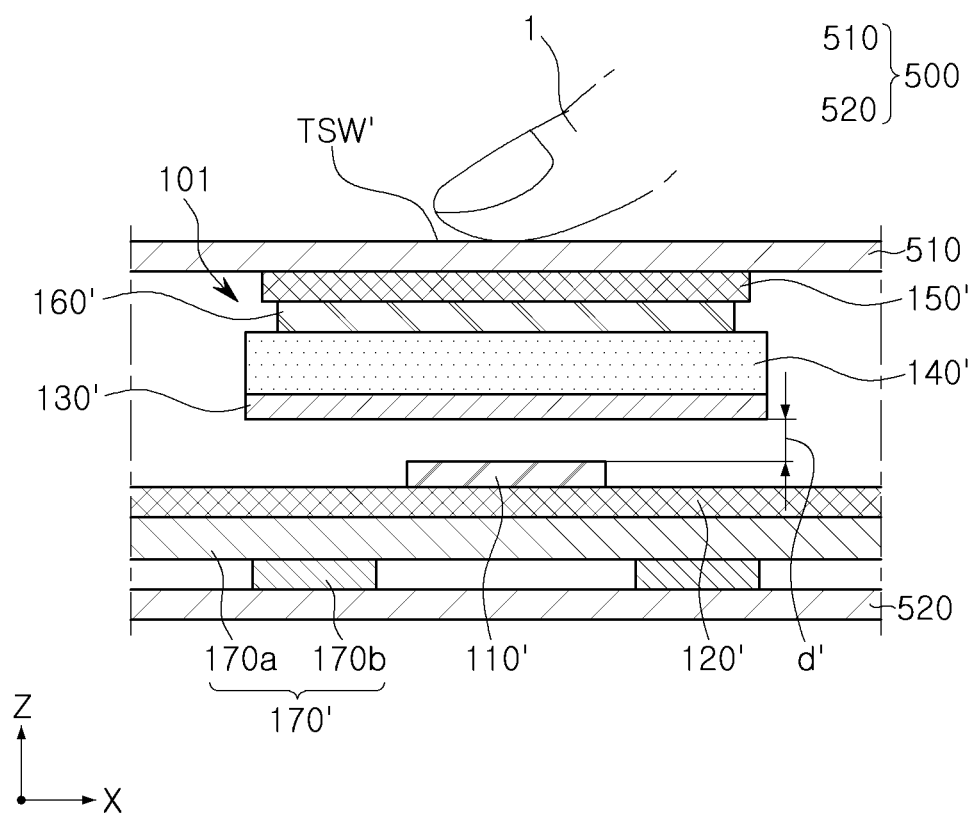
FIG. 8 is a front view of an electronic device, including a touch sensing module according to a first modified embodiment, taken in an X-Z direction.

FIG. 8 is a front view of an electronic device, including a touch sensing module according to a first modified embodiment, taken in an X-Z direction.

Referring to FIG. 8, in an electronic device 10-2 according to the present modified embodiment, a touch sensing module 101 may be disposed between an outer housing 510 and an inner housing 520. The touch sensing module 101 may include a sensing coil 110', a first substrate 120', a metal portion 130', a first bracket 140', a second substrate 150', a pad 160', and a second bracket 170'.

The sensing coil 110', the first substrate 120', the first bracket 140', the second substrate 150', and the pad 160' of the touch sensing module 101 may be the same as the above-described components of the touch sensing module 100 of FIG. 2A, respectively. Thus, the overlapping descriptions of the details thereof will be omitted.

Hereinafter, a description will be provided while focusing on differences from the touch sensing module 100 illustrated in FIG. 2A.

Referring to FIG. 8, the touch sensing module 101 according to the present modified embodiment may include a metal portion 130' spaced apart from a first substrate 120'. For example, the metal portion 130' may be spaced apart from the sensing coil 110' by a predetermined distance d' without a portion in contact with the first substrate 120'.

In this case, although not illustrated in the drawing, the metal portion may be disposed to be in contact with an external surface of a sensing coil.

The specific shape of the metal portion 130' may vary. For example, the metal portion 130' may have a flat plate shape, as illustrated in FIG. 8. In this case, one surface of the metal portion 130' may overlap at least a portion of the sensing coil 110'.

The metal portion 130' may move in a direction toward the sensing coil 110' as a touch is applied to a touch switch portion TSW'. The metal portion 130' may serve to induce a change in inductance of the sensing coil 110' as the separation distance d' between the sensing coil 110' and the metal portion 130' is decreased.

Unlike the metal portion 130 illustrated in FIG. 2A, the metal portion 130' according to the present modified embodiment does not have a pressurization portion 132. Therefore, the metal portion 130' may descend without being deformed even when a touch is applied.

The metal portion 130' may include a sensing region overlapping a winding surface of the sensing coil 110'. As the metal portion 130' descends toward the sensing coil 110', a separation distance d' between the sensing region and the sensing coil 110' may be decreased, as compared with before the touch is applied. An inductance of the sensing coil 110' may be changed as the sensing region of the metal portion 130' approaches the sensing coil 110'.

According to the present modified embodiment, the first and second substrates 120' and 150' may be connected to each other to form a single substrate. For example, the first and second substrates 120' and 150' may be integrated as an entire substrate on which the sensing coil 110' and the pad 160' are mounted, and a portion of the substrate may be bent to be implemented as the first and second substrates 120' and 150'. Accordingly, the sensing coil 110' and the pad 160' may be mounted together on the same surface of the integrated substrate.

Referring to FIG. 8, the second bracket 170' included in the electronic device 10-2 according to the present modified embodiment may include a support portion 170a and an elastic portion 170b.

The support portion 170a of the second bracket 170' may be in contact with the first substrate 120' and may have a plate shape parallel to the first substrate 120'. When a touch is applied to the touch switch portion TSW' by a user's hand 1, a pressure transmitted to the second substrate 150' may be transmitted to the support portion 170a via the first substrate 120'.

The elastic portion 170b may be disposed to support the support portion 170a, and may be compressed to be deformed by a pressure received from the support portion 170a as a touch is applied. When the elastic portion 170b is compressed to be deformed, an entire structure of the touch sensing module 101 including the second bracket 170' may descend.

The elastic portion 170b may serve to support the touch sensing module 101 such that the touch sensing module 101 may be stably seated inside the electronic device 10-2, and may simultaneously serve to buffer a portion of the pressure transferred to an inside of the electronic device 10-2 by a touch applied by a user.

In addition, the metal portion 130' according to the present modified embodiment may include the second bracket 170' provided with the elastic portion 170b, rather than the metal portion 130' provided with a pressurization portion 132. Thus, exceeding an assembly tolerance may be prevented from occurring when a touch module is installed.

For example, optionally, the metal portion 130 may be provided with the pressurization portion 132 as illustrated in FIG. 2A, or the second bracket 170' may be provided with the elastic portion 170b as illustrated in FIG. 8, so that the assembly tolerance may be compensated for to easily install or remove the touch sensing module in or from an electronic device.

Figure 9:
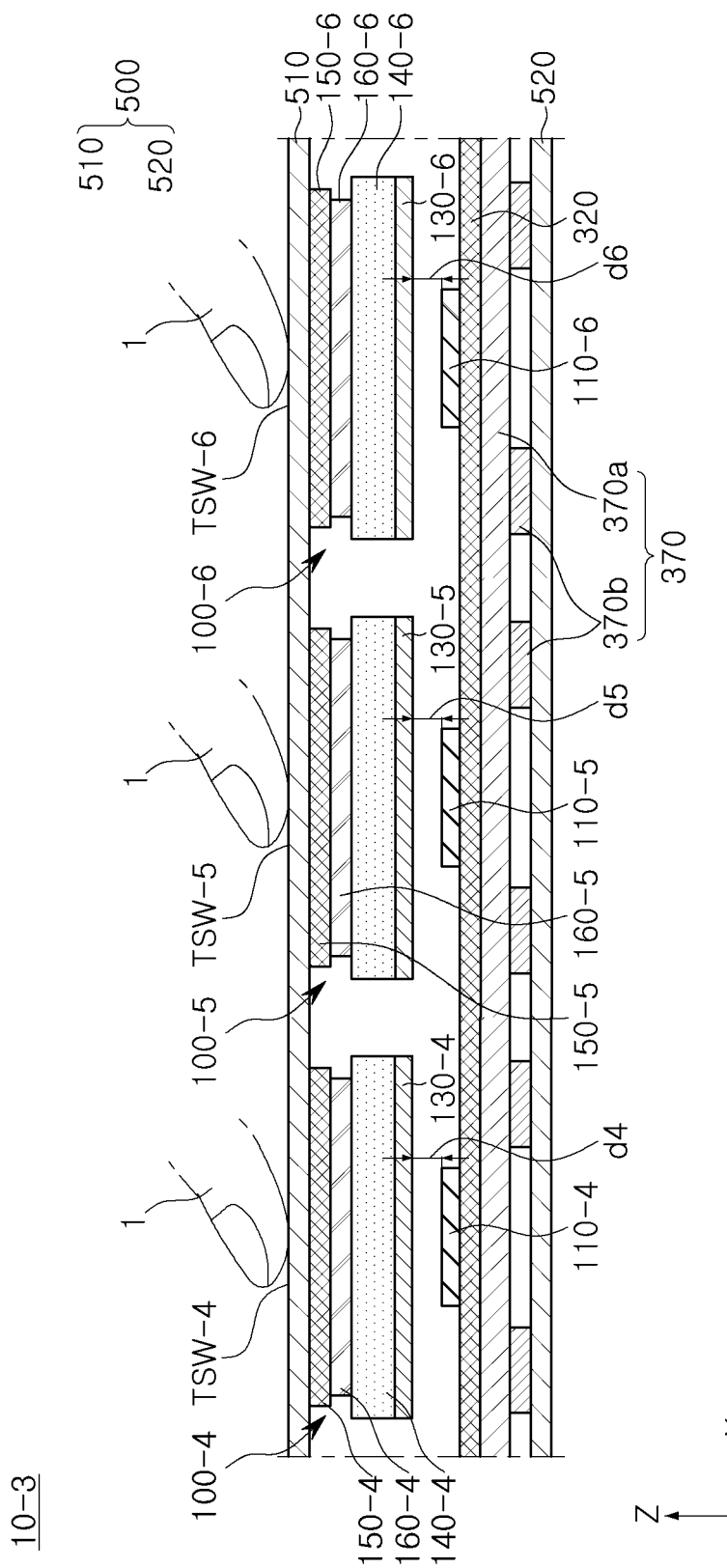
FIG. 9 is a front view of an electronic device, including a touch sensing module according to a second modified embodiment, taken in an X-Z direction.

FIG. 9 is a front view of an electronic device, including a touch sensing module according to a second modified embodiment, taken in an X-Z direction.

Referring to FIG. 9, the electronic device 10-3 according to the present modification may include a plurality of touch sensing modules 100-4, 100-5, and 100-6. For reference, FIG. 9 illustrates only an example in which three touch sensing modules are included in the electronic device 10-3, but various numbers of touch sensing modules such as two sensing modules or four or more sensing modules may be included in the electronic device 10-3, as necessary.

The electronic device 10-3 according to the present modified embodiment may include a plurality of touch switch portions TSW-4, TSW-5, and TSW-6, respectively corresponding to the plurality of touch sensing modules 100-4, 100-5, and 100-6.

In general, the plurality of touch sensing modules 100-4, 100-5, and 100-6 may correspond to different touch switch portions TSW-1, TSW-2, and TSW-3 to perform separate button functions, respectively. However, each of a plurality of touch sensing modules may correspond to a single touch switch portion to perform a function of improving sensitivity of a sensor.

A plurality of metal portions 130-4, 130-5, and 130-6 and a plurality of first brackets 140-4, 140-5, and 140-6 according to the present embodiment may have horizontal widths, respectively limited to predetermined lengths, as illustrated in FIG. 9.

For example, the metal portions 130-4, 130-5, and 130-6, included in the plurality of touch sensing modules 100-4, 100-5, and 100-6, may be formed to be separated from each other without being connected to each other. In addition, the first brackets 140-4, 140-5, and 140-6, included in the plurality of touch sensing modules 100-4, 100-5, and 100-6, may be formed to be separated from each other without being connected to each other.

As described above, each metal portion and each first bracket, included in different touch sensing modules, may be formed not to be integrated with each other but to be separated from each other, so that a pressure generated by a touch applied to a single touch switch portion may be intensively transferred to a single sensing coil. Accordingly, an effect of a touch, applied by a user, on adjacent touch sensing modules may be significantly reduced. Thus, a malfunction of force sensing may be reduced.

Referring to FIG. 9, the touch sensing module 100-4 according to the present modified embodiment may include a sensing coil 110-4, a metal portion 130-4, a first bracket 140-4, a second substrate 150-4, and a pad 160-4. In addition, the touch sensing module 100-5 according to the present modified embodiment may include a sensing coil 110-5, a metal portion 130-5, a first bracket 140-5, and a second substrate 150-5, and a pad 160-5. In addition, the touch sensing module 100-6 according to the present modified embodiment may include a sensing coil 110-6, a metal portion 130-6, a first bracket 140-6, a second substrate 150-6, and a pad 160-6.

The above components may be the same as the sensing coil 110', the metal portion 130', the first bracket 140', the second substrate 150', and the pad 160' included in the touch sensing module 101 of FIG. 8, respectively. Thus, the overlapping descriptions of the details thereof will be omitted.

The electronic device 10-3 according to the present modified embodiment may include a single first substrate 320, as illustrated in FIG. 9.

The first substrate 320 may have an area in which the plurality of sensing coils 110-4, 110-5, and 110-6 are disposed, and may be supported by the second bracket 370. For example, the first substrate 320 may be integrally formed to simultaneously support the plurality of touch sensing modules 100-4, 100-5, and 100-6.

The first substrate 320 may correspond to an FPCB, but is not limited thereto. For example, the first substrate 320 may employ various types of substrate having a structure, in which at least one metal layer and at least one wiring layer are alternately stacked, other than the FPCB.

The metal portion 130-4 of the touch sensing module 100-4 according to the present modified embodiment may approach the sensing coil 110-4 as a touch is applied to the touch switch portion TSW-4. Accordingly, a separation distance d4 between the metal portion 130-4 and the sensing coil 110-4 may be decreased, and an inductance generated in the sensing coil 110-4 may be changed.

The metal portion 130-5 of the touch sensing module 100-5 may approach the sensing coil 110-5 as a touch is applied to the touch switch portion TSW-5. Accordingly, a separation distance d5 between the metal portion 130-5 and the sensing coil 110-5 may be decreased, and an inductance generated in the sensing coil 110-5 may be changed.

The metal portion 130-6 of the touch sensing module 100-6 may approach the sensing coil 110-6 as a touch is applied to the touch switch portion TSW-6. Accordingly, a separation distance d6 between the metal portion 130-6 and the sensing coil 110-6 may be decreased, and an inductance generated in the sensing coil 110-6 may be changed.

As illustrated in FIG. 9, the electronic device 10-3 according to the present embodiment may further include a second bracket 370. The second bracket 370 may be disposed between the first substrate 320 and the inner housing 520 to support the first substrate 320.

The second bracket 370 may include a support portion 370a and an elastic portion 370b. The support portion 370a of the second bracket 370 may be in contact with the first substrate 320, and may have a plate shape parallel to the first substrate 320. When a touch is applied to each of the touch switch portions TSW-4, TSW-5, and TSW-6, a pressure generated by the touch may be transmitted to the support portion 370a through the first substrate 320.

The elastic portion 370b may be disposed to support the support portion 370a, and may be compressed to be deformed by a pressure received from the support portion 370a as a touch is applied. When the elastic portion 370b is compressed to be deformed, an entire structure of a touch sensing module corresponding to the touch switch portion, to which the touch is applied, may descend.

The elastic portion 370b may serve to support the plurality of touch sensing modules 100-4, 100-5, and 100-6 such that they may be stably seated inside the electronic device 10-3 and, at the same time, may serve to buffer a portion of the pressure transferred to an inside of the electronic device 10-3 by the touch applied by a user.

The second bracket 370 is not limited to a special material, and may be formed of a non-conductor such as plastic or a conductor such as a metal.

Figure 10:
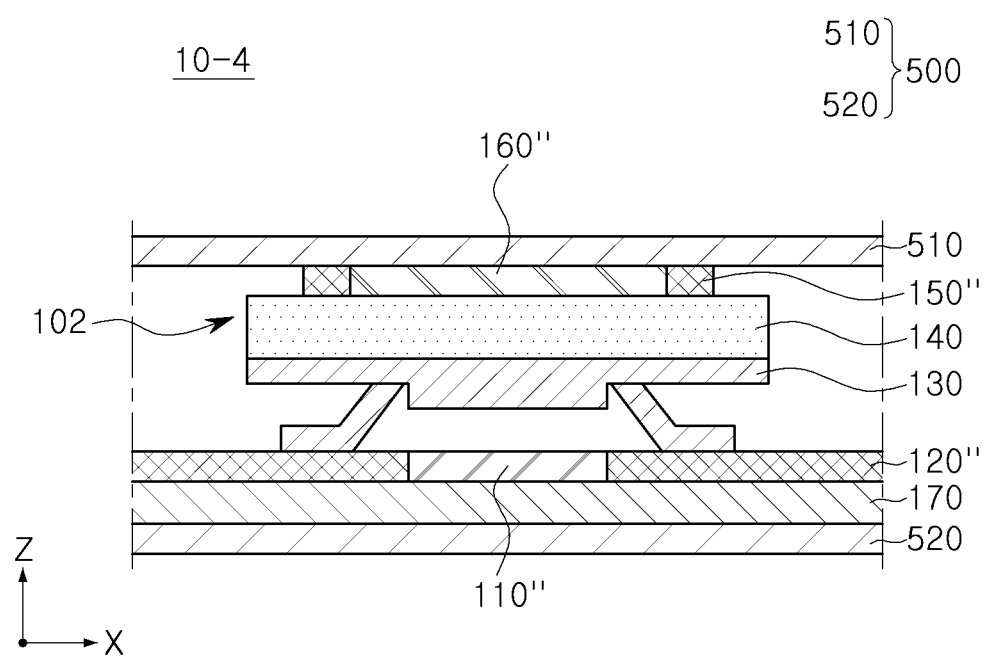
FIG. 10 is a front view of an electronic device, including a touch sensing module according to a third modified embodiment, taken in an X-Z direction.

FIG. 10 is a front view of an electronic device, including a touch sensing module according to a third modified embodiment, taken in an X-Z direction.

Referring to FIG. 10, a touch sensing module 102 according to the third modified embodiment may include a first substrate 120", a metal portion 130, a first bracket 140, a second substrate 150", and a second bracket 170.

The metal portion 130, the first bracket 140, and the second bracket 170 according to the present modified embodiment may be the same as those in the embodiment of FIG. 2A, respectively. Thus, the overlapping descriptions of the details thereof will be omitted.

The first substrate 120" may be supported by the second bracket 170, and may be in contact with a portion of the metal portion 130. The first substrate 120" may correspond to an FPCB, but is not limited thereto. For example, the first substrate 120" may employ various types of substrate having a structure, in which at least one metal layer and at least one wiring layer are alternately stacked, other than the FPCB.

In this case, the first substrate 120" according to the third modified embodiment may include a coil pattern 110" having a variable inductance. That is, unlike the manner in which the sensing coil is disposed to be mounted on one surface of a substrate as illustrated in FIG. 2, the first substrate 120" may be disposed in a manner, in which a conductor pattern is printed inside the first substrate 120", or the like.

Accordingly, as illustrated in FIG. 10, a coil may not protrude to one surface of the first substrate 120", and a separation distance between the coil pattern 110" and the metal portion 130 may be secured to be longer.

Similarly to a sensing coil, due to a change in distance between the coil pattern 110" and the metal portion 130, an inductance of the coil pattern 110" may be increased or decreased (L±ΔL). By sensing the change in inductance, the touch sensing module 102 may perform inductive sensing to determine whether a touch input is applied.

The second substrate 150" may be disposed between an outer housing 510 and a pad 160". The second substrate 150" may correspond to an FPCB, but is not limited thereto. For example, the second substrate 150" may employ various types of substrate having a structure, in which at least one metal layer and at least one wiring layer are alternately stacked, other than the FPCB.

In this case, the second substrate 150" according to the third modified embodiment may include a pad 160" having a variable capacitance. That is, unlike the manner in which that the pad 160 is disposed to be mounted on one surface of the substrate as illustrated in FIG. 2A, the second substrate 150" may be disposed in a manner, in which it is embedded in the second substrate 150", or the like.

Accordingly, as illustrated in FIG. 10, the pad 160" may not protrude to one surface of the second substrate 150", and the pad 160" and the outer housing 510 may come closer to each other. Thus, a change in capacitance may be more precisely detected.

FIGS. 11A to 11E are schematic views illustrating an assembly structure of components of a touch sensing module.

Figure 11A:
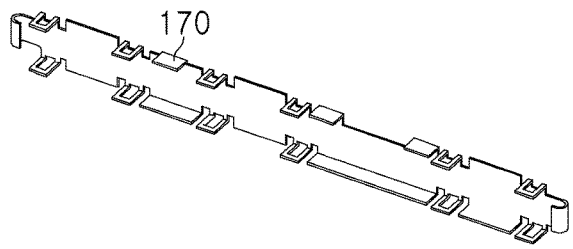
FIGS. 11A to 11E are schematic views illustrating an assembly structure of components of a touch sensing module.
Figure 11B:
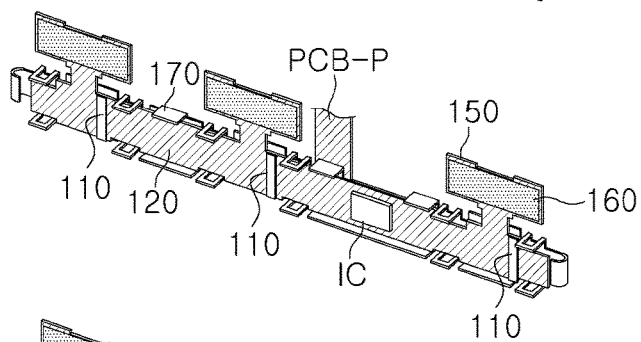

FIG. 11A is a structural view illustrating an example where a second bracket 170 is removed from a first substrate 120, FIG. 11B is a structural view illustrating an example where the first substrate 120 and the second bracket 170 are coupled to each other.

Referring to FIGS. 11A and 11B, the second bracket 170 illustrated in FIG. 11A may be coupled to the first substrate 120, as illustrated in FIG. 11B. In addition, a plurality of sensing coils 110 may be disposed on the first substrate 120. In addition, a plurality of second substrates 150 may be connected to a single first substrate 120.

Figure 11C:
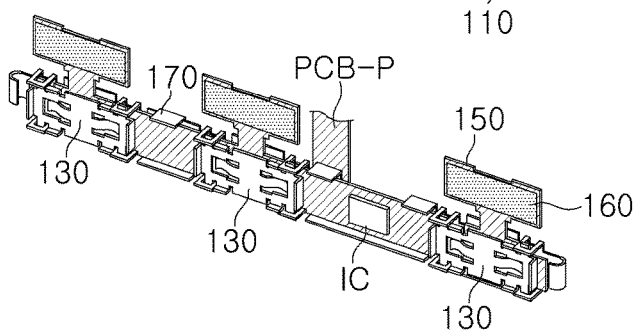
Figure 11D:
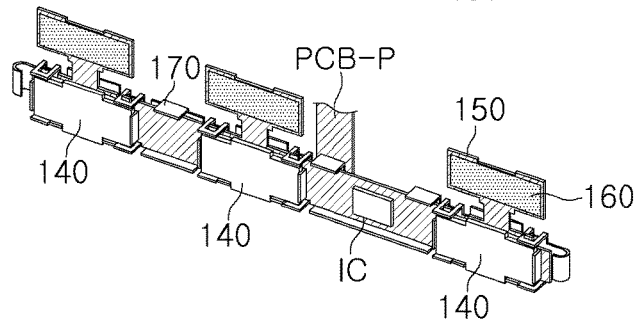

FIG. 11C is a structural view illustrating an example where a metal portion 130 is disposed on each of the plurality of sensing coils 110 disposed on the first substrate 120, and FIG. 11D is a structural view illustrating an example where the first bracket 140 is disposed on each of a plurality of metal portions 130.

Referring to FIGS. 11C and 11D, a structure illustrated in FIG. 11C is an example of a structure in which the plurality of metal portions 130 are respectively spaced apart from the plurality of sensing coils 110 disposed on the first substrate 120 in the structure illustrated in FIG. 11B, and a structure illustrated in FIG. 11D is an example structure in which the first bracket 140 is disposed on each of the plurality of metal portions 130 in the structure illustrated in FIG. 11C.

Figure 11E:
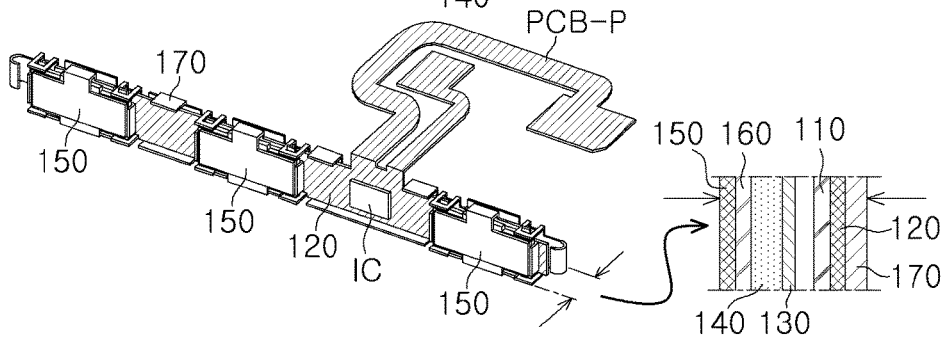

FIG. 11E is a structural view illustrating that the second substrate 150 is bent to be disposed on the first bracket 140 in the structure illustrated in FIG. 11D.

Referring to FIG. 11E, a second substrate 150 may be disposed on the first bracket 140 while being bent in the state of being connected to the first substrate 120. In addition, a connection pad PCB-P may be connected to the first substrate 120 to be connected to a set mainboard.

Figure 12A:
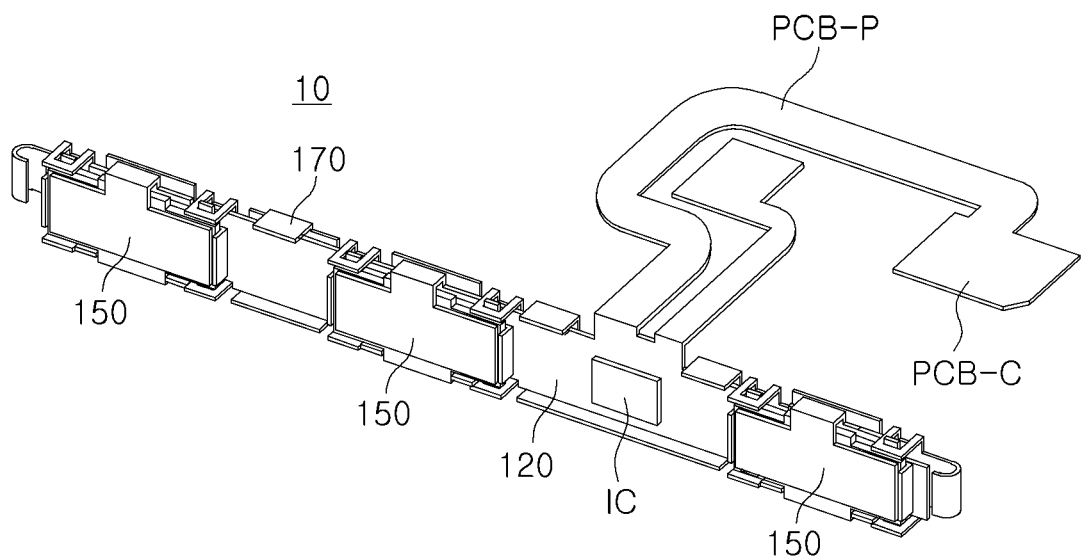
FIG. 12A is a schematic view of an assembly structure of a touch sensing module.
Figure 12B:
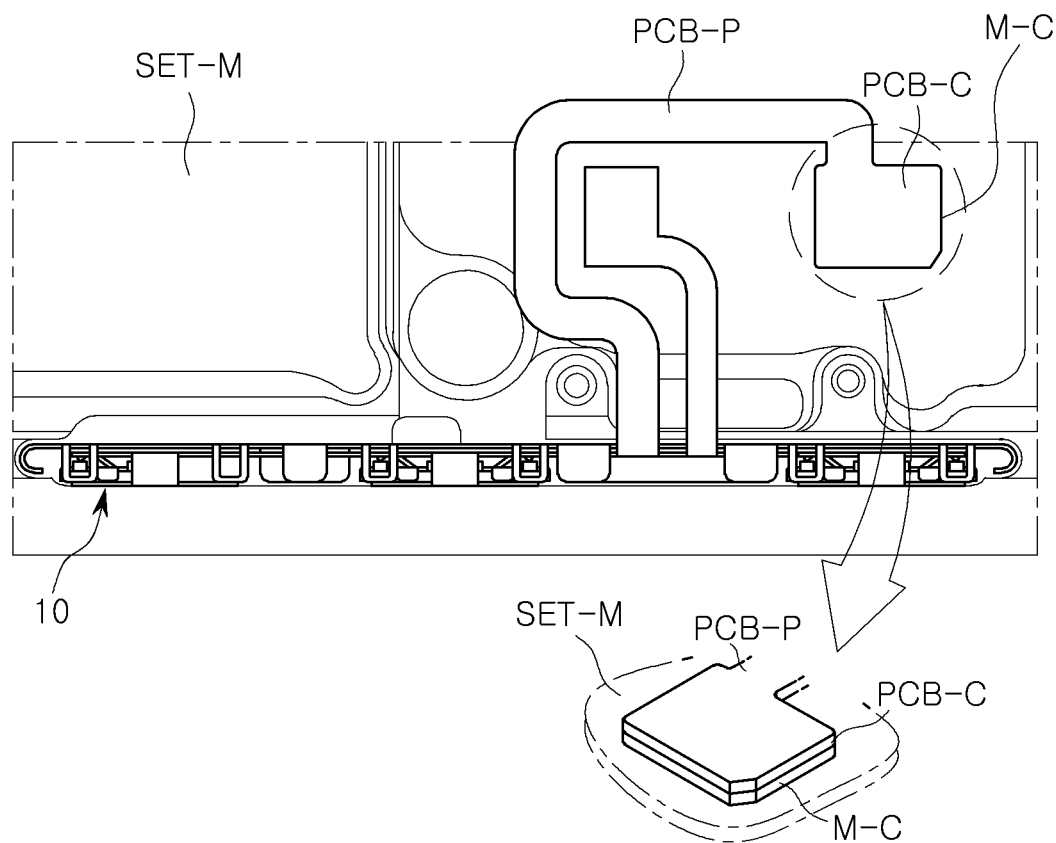
FIG. 12B is a view illustrating an example of a connection between a touch sensing module and a set mainboard.

FIG. 12A is a schematic view of an assembly structure of a touch sensing module, and FIG. 12B is a view illustrating an example of a connection between a touch sensing module and a set mainboard.

Referring to FIGS. 12A and 12B, a connector PCB-C of a connection pad PCB-P, connected to a first board 120, may be connected to a connector MC of a set mainboard SET-M. Accordingly, the first substrate 120 may be connected to the set mainboard SET-M through the connection pad PCB-P.

As described above, sensitivity to a force touch and a contact touch may be improved.

In addition, brackets are formed to be individually separated in each sensor. Thus, signal separation may be achieved to prevent a malfunction caused by signal interference and noise occurring between different sensors.

In addition, hybrid sensing may be performed by a single touch operation to simultaneously sense a force touch input and a contact touch input.

In addition, even when a housing of an electronic device is not formed of a metallic material, a metal portion may be provided in a touch model itself installed inside the electronic device to perform a function of a force sensor.

In addition, at least one of a bracket disposed between a pad and a sensing coil and a bracket disposed between a substrate and an inner housing of the electronic device may be provided with a member compressed to be deformed according to a touch. Thus, exceeding an assembly tolerance may be prevented from occurring when a touch module is installed.

While specific examples have been illustrated and described above, it will be apparent after gaining an understanding of this disclosure that various changes in form and details may be made in these examples without departing from the spirit and scope of the claims and their equivalents. The examples described herein are to be considered in a descriptive sense only, and not for purposes of limitation. Descriptions of features or aspects in each example are to be considered as being applicable to similar features or aspects in other examples. Suitable results may be achieved if the described techniques are performed in a different order, and/or if components in a described system, architecture, device, or circuit are combined in a different manner, and/or replaced or supplemented by other components or their equivalents. Therefore, the scope of the disclosure is defined not by the detailed description, but by the claims and their equivalents, and all variations within the scope of the claims and their equivalents are to be construed as being included in the disclosure.

What is claimed is:

1. A touch sensing module comprising:
a sensing coil;
a metal portion disposed to be spaced apart from the sensing coil;
a first bracket having one surface, on which the metal portion is disposed, and an other surface, opposing the one surface, on which a pad having capacitance, configured to vary as a touch is applied, is disposed;
a second substrate having an area in which the pad is disposed;
a first substrate having an area in which the sensing coil is disposed; and
a second bracket supporting the first substrate.

2. The touch sensing module of claim 1, wherein the metal portion comprises:
a connection portion connected to the first bracket; and
a pressurization portion extending from the connection portion and configured to deform as a touch is applied.

3. The touch sensing module of claim 2,
wherein the pressurization portion has one end connected to the connection portion, and an other end connected to the first substrate.

4. The touch sensing module of claim 3, wherein the first and second substrates are connected to each other to form a single substrate.

5. The touch sensing module of claim 2, wherein the metal portion further comprises:
a sensing region protruding in a direction, in which the sensing coil is disposed, and overlapping a winding surface of the sensing coil.

6. The touch sensing module of claim 1,
wherein the metal portion is disposed to be spaced from the first substrate.

7. The touch sensing module of claim 6,
wherein the second bracket comprises:
a support portion in contact with the first substrate; and
an elastic portion receiving a pressure from the support portion configured to be compressed to be deformed.

8. The touch sensing module of claim 1, wherein the sensing coil and the pad are electrically connected to each other to form a resonance circuit, and
wherein the resonance circuit generates a resonance signal having a resonant frequency configured to vary as a touch is applied.

9. The touch sensing module of claim 8, further comprising:
a detection circuit electrically connected to the resonance circuit and configured to generate a touch input signal based on an amount of a change in the resonant frequency of the generated resonance signal.

10. The touch sensing module of claim 9, wherein the detection circuit detects a position, to which a touch is applied, based on a change in resonant frequency depending on a change in capacitance of the pad, and generates a contact touch input signal including information of the detected position.

11. The touch sensing module of claim 9, wherein the detection circuit detects an intensity of a pressure, generated by a touch, based on a change in resonant frequency depending on a change in inductance of the sensing coil, and generates a force touch input signal matching the detected intensity of the pressure.

12. The touch sensing module of claim 1, wherein the pad constitutes a pad resonance circuit, and the sensing coil constitutes a sensing coil circuit, and
wherein the pad resonance circuit and the sensing coil resonance circuit generate a first resonance signal and a second resonance signal having resonant frequencies varying as a touch is applied, respectively.

13. The touch sensing module of claim 12, further comprising:
a detection circuit electrically connected to the pad resonance circuit and the sensing coil resonance circuit,
wherein the detection circuit generates a contact touch input signal based on an amount of a change in resonant frequency of the first resonance circuit, and generates a force touch input signal based on an amount of a change in resonant frequency of the second resonance signal.

14. An electronic device comprising:
the touch sensing module of claim 1; and
a housing comprising a touch switch portion overlapping the touch sensing module.

15. The touch sensing module of claim 1, wherein the second substrate comprises a metal layer and a wiring layer alternately stacked.

16. An electronic device comprising:
a housing including an outer housing, including a touch switch portion, and an inner housing disposed to be spaced apart from the outer housing;
a touch sensing module disposed between the outer housing and the inner housing;
a first substrate on which the sensing coil is disposed; and
a second bracket disposed between the first substrate and the inner housing to support the first substrate,
wherein the touch sensing module comprises:
a sensing coil disposed to be spaced apart from the outer housing;
a metal portion disposed between the outer housing and the sensing coil and spaced apart from the sensing coil; and
a first bracket having one surface, facing the inner housing, on which the metal portion is disposed, and an other surface, facing the outer housing, on which a pad, having capacitance configured to vary as a touch is applied, is disposed.

17. The electronic device of claim 16, wherein the metal portion comprises:
a connection portion in contact with the first bracket; and
a pressurization portion extending from the connection portion in a direction toward the inner housing and configured to deform as a touch is applied.

18. The electronic device of claim 16, wherein
the first substrate has an area in which the sensing coil is disposed.

19. The electronic device of claim 18, wherein the second bracket comprises:
a support portion in contact with the first substrate; and
an elastic portion receiving a pressure from the support portion configured to be compressed to be deformed.

20. The electronic device of claim 16, wherein the touch sensing module includes a plurality of touch sensing modules, and
wherein the touch switch portion includes a plurality of touch switch portions, respectively corresponding to the plurality of touch sensing modules.

21. The electronic device of claim 20, wherein first brackets, included in the plurality of touch sensing modules, are formed to be separated from each other and metal portions, included in the plurality of touch sensing modules, are formed to be separated from each other.

22. The electronic device of claim 16, wherein at least partial regions of the touch switch portion, the pad, and the sensing coil overlap each other.

23. A touch sensing module comprising:
- a pad, a first bracket, a metal portion, and a sensing coil facing and spaced apart from the metal portion, disposed in this order in a touch direction, which is a direction in which a touch is applied;
- a substrate, comprising a metal layer and a wiring layer alternately stacked;
- a first substrate having an area in which the sensing coil is disposed; and
- a second bracket supporting the first substrate,
- wherein the pad, disposed in an area of the substrate, comprises a capacitance configured to vary in response to a touch.

24. The touch sensing module of claim 23, wherein the second bracket is disposed such that the sensing coil is between the metal portion and the second bracket.

25. The touch sensing module of claim 24, wherein
- the metal portion comprises a pressurization portion extending in the touch direction configured to deform in response to the touch, and/or
- the second bracket comprises an elastic portion extending in the touch direction configured to deform in response to the touch.

* * * * *